(12) United States Patent
Kim et al.

(10) Patent No.: US 10,861,863 B2
(45) Date of Patent: Dec. 8, 2020

(54) THREE-DIMENSIONAL SEMICONDUCTOR MEMORY DEVICE

(71) Applicant: SAMSUNG ELECTRONICS CO., LTD., Suwon-si (KR)

(72) Inventors: Jongwon Kim, Hwaseong-si (KR); Minyeong Song, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/235,217

(22) Filed: Dec. 28, 2018

(65) Prior Publication Data
US 2019/0333923 A1 Oct. 31, 2019

(30) Foreign Application Priority Data
Apr. 25, 2018 (KR) .................. 10-2018-0048081

(51) Int. Cl.
*H01L 27/11556* (2017.01)
*H01L 27/11582* (2017.01)
*H01L 27/11529* (2017.01)
*H01L 27/11573* (2017.01)
*H01L 27/11575* (2017.01)
*H01L 27/11548* (2017.01)
*H01L 23/522* (2006.01)
(Continued)

(52) U.S. Cl.
CPC .. *H01L 27/11556* (2013.01); *H01L 27/11529* (2013.01); *H01L 27/11548* (2013.01); *H01L 27/11573* (2013.01); *H01L 27/11575* (2013.01); *H01L 27/11582* (2013.01); *H01L 23/5226* (2013.01); *H01L 27/11519* (2013.01); *H01L 27/11565* (2013.01)

(58) Field of Classification Search
CPC ......... H01L 27/11556; H01L 27/11582; H01L 27/11529; H01L 27/11548; H01L 27/11575; H01L 27/22573; H01L 27/11519; H01L 23/5226; H01L 27/11565; H01L 23/522
USPC ........................................ 257/314
See application file for complete search history.

(56) References Cited

U.S. PATENT DOCUMENTS 9,478,561 B2    10/2016   Kim et al.
9,576,967 B1 *  2/2017    Kimura ............ H01L 27/11582
(Continued)

FOREIGN PATENT DOCUMENTS

KR      10-2019-0011632       2/2019

*Primary Examiner* — Alexander O Williams
(74) *Attorney, Agent, or Firm* — F. Chau & Associates, LLC

(57) ABSTRACT

A three-dimensional semiconductor memory device includes a horizontal semiconductor layer provided on a lower insulating layer. The horizontal semiconductor layer includes a cell array region and a connection region. An electrode structure is provided including electrodes. The electrodes are stacked on the horizontal semiconductor layer. The electrodes have a staircase structure on the connection region. A plurality of first vertical structures are provided on the cell array region to penetrate the electrode structure. A plurality of second vertical structures are provided on the connection region to penetrate the electrode structure and the horizontal semiconductor layer. Bottom surfaces of the second vertical structures are positioned at a level lower than a bottom surface of the horizontal semiconductor layer.

20 Claims, 39 Drawing Sheets

(51) Int. Cl.
*H01L 27/11519* (2017.01)
*H01L 27/11565* (2017.01)

(56) References Cited

U.S. PATENT DOCUMENTS

| | | | |
|---|---|---|---|
| 9,601,577 B1* | 3/2017 | Lee | H01L 27/11578 |
| 9,698,150 B2 | 7/2017 | Maegawa et al. | |
| 9,716,104 B2* | 7/2017 | Kim | H01L 27/11565 |
| 9,786,681 B1 | 10/2017 | Ariyoshi | |
| 9,847,341 B2 | 12/2017 | Shin et al. | |
| 2016/0049423 A1* | 2/2016 | Yoo | H01L 27/1157 |
| | | | 257/324 |
| 2016/0293539 A1* | 10/2016 | Park | H01L 27/11548 |
| 2017/0117292 A1 | 4/2017 | Tang et al. | |
| 2017/0148804 A1 | 5/2017 | Lee et al. | |
| 2017/0352680 A1 | 12/2017 | Shin et al. | |
| 2017/0358590 A1 | 12/2017 | Kang et al. | |
| 2018/0090512 A1* | 3/2018 | Kim | H01L 21/31053 |
| 2019/0035807 A1* | 1/2019 | Kim | H01L 27/11548 |

* cited by examiner

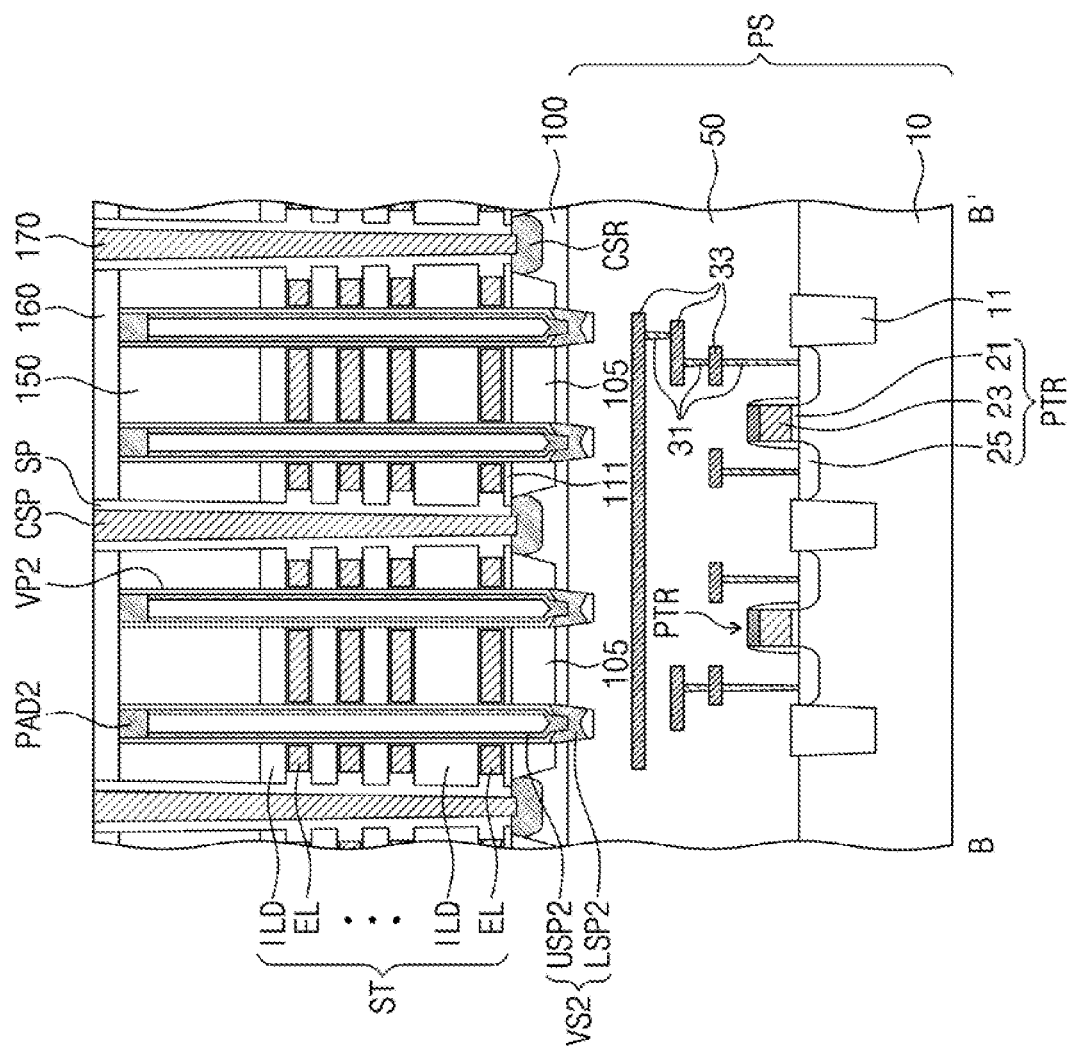

THREE-DIMENSIONAL SEMICONDUCTOR MEMORY DEVICE

CROSS-REFERENCE TO RELATED APPLICATION

This U.S. non-provisional patent application claims priority under 35 U.S.C. § 119 to Korean Patent Application No. 10-2018-0048081, filed on Apr. 25, 2018, in the Korean Intellectual Property Office, the disclosure of which is incorporated by reference herein in its entirety.

TECHNICAL FIELD

Exemplary embodiments of the present inventive concept relate to a semiconductor memory device, and more particularly, to a three-dimensional semiconductor memory device.

DISCUSSION OF RELATED ART

In the case of semiconductor devices, integration of semiconductor devices may be a factor in determining product prices, and thus semiconductor devices may be increasingly integrated. In the case of two-dimensional or planar semiconductor devices, their integration may be determined by the area occupied by a unit memory cell, and thus integration of two-dimensional semiconductor devices may be influenced by the level of a fine pattern forming technology. However, the process equipment used for forming fine patterns in two-dimensional semiconductor devices may set a practical limitation on increasing integration for two-dimensional or planar semiconductor devices. Thus, three-dimensional semiconductor memory devices including three-dimensionally arranged memory cells may be employed to increase device integration.

SUMMARY

An exemplary embodiment of the present inventive concept provides a relatively highly-reliable, relatively highly-integrated three-dimensional semiconductor memory device.

According to an exemplary embodiment of the present inventive concept, a three-dimensional semiconductor memory device includes a horizontal semiconductor layer provided on a lower insulating layer. The horizontal semiconductor layer includes a cell array region and a connection region. An electrode structure is provided including electrodes. The electrodes are stacked on the horizontal semiconductor layer. The electrodes have a staircase structure on the connection region. A plurality of first vertical structures are provided on the cell array region to penetrate the electrode structure. A plurality of second vertical structures are provided on the connection region to penetrate the electrode structure and the horizontal semiconductor layer. Bottom surfaces of the second vertical structures are positioned at a level lower than a bottom surface of the horizontal semiconductor layer.

According to an exemplary embodiment of the present inventive concept, a three-dimensional semiconductor memory device includes a horizontal semiconductor layer on a lower insulating layer. The horizontal semiconductor layer includes a cell array region and a connection region. An electrode structure includes electrodes. The electrodes are vertically stacked on the horizontal semiconductor layer. A plurality of first vertical structures are provided on the cell array region to penetrate the electrode structure. A plurality of second vertical structures are provided on the connection region to penetrate the electrode structures. Each of the first and second vertical structures includes a lower semiconductor pattern and an upper semiconductor pattern connected to the lower semiconductor pattern. In the second vertical structures, top surfaces of the lower semiconductor patterns are positioned at a level lower than a bottom surface of a lowermost one of the electrodes. Bottom surfaces of the lower semiconductor patterns are positioned at a level lower than a bottom surface of the horizontal semiconductor layer.

According to an exemplary embodiment of the present inventive concept, a three-dimensional semiconductor memory device includes a horizontal semiconductor layer provided on a lower insulating layer. The horizontal semiconductor layer includes a cell array region and a connection region. A dummy insulating pattern is provided in the connection region of the horizontal semiconductor layer. An electrode structure includes electrodes. The electrodes are stacked on the horizontal semiconductor layer to have a staircase structure on the dummy insulating pattern. A plurality of first vertical structures are provided on the cell array region to penetrate the electrode structure. First vertical insulating patterns are provided between the first vertical structures and the electrode structure. A plurality of second vertical structures are provided on the connection region to penetrate the electrode structure, the dummy insulating pattern, and the horizontal semiconductor layer. Second vertical insulating patterns are provided between the second vertical structures and the electrode structure and between the second vertical structures and the dummy insulating pattern.

According to an exemplary embodiment of the present inventive concept, a three-dimensional semiconductor memory device includes a semiconductor substrate and a lower insulating layer disposed on the semiconductor substrate. A horizontal semiconductor layer is disposed on the lower insulating layer. A dummy insulating pattern is formed in the horizontal semiconductor layer. An electrode structure is disposed on the horizontal semiconductor layer. The electrode structure includes a plurality of electrodes and a plurality of insulating layers that are alternately and repeatedly stacked. A plurality of first vertical structures penetrate the electrode structure. Bottom surfaces of the first vertical structures are positioned between an upper surface of the horizontal semiconductor layer and a lower surface of the horizontal semiconductor layer. A plurality of second vertical structures penetrate the electrode structure and the dummy insulating pattern. Bottom surfaces of the second vertical structures are positioned below the bottom surface of the horizontal semiconductor layer.

BRIEF DESCRIPTION OF THE DRAWINGS

The above and other features of the inventive concept will become more apparent by describing in detail exemplary embodiments thereof, with reference to the accompanying drawings, in which:

FIG. 14 is a cross-sectional view, which is taken along line B-B' of FIG. 3A, of a three-dimensional semiconductor memory device according to an exemplary embodiment of the present inventive concept.

FIGS. 20A, 21A, 22A, 23A, 24A, 25A, 26A, 20B, 21B, 22B, 23B, 24B, 25B and 26B are cross-sectional views of a method of fabricating a three-dimensional semiconductor memory device, according to an exemplary embodiment of the present inventive concept.

DETAILED DESCRIPTION

Figure 1:
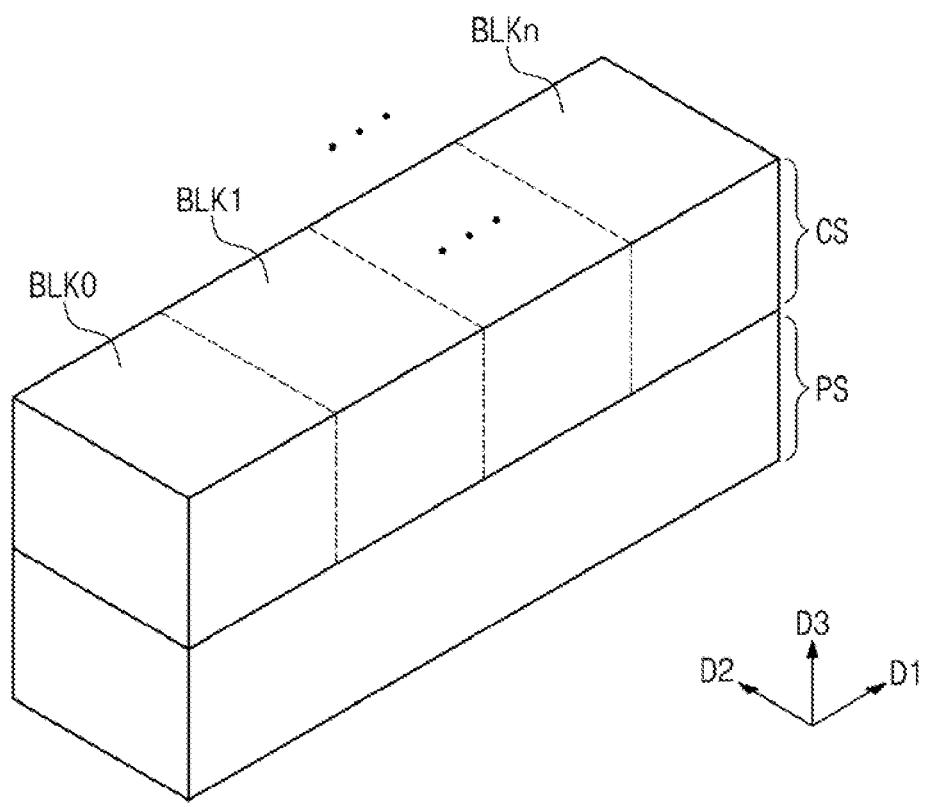
FIG. 1 is a perspective view of a three-dimensional semiconductor memory device according to an exemplary embodiment of the present inventive concept.

Exemplary embodiments of the present inventive concept will be described below in more detail with reference to the accompanying drawings. In this regard, the exemplary embodiments may have different forms and should not be construed as being limited to the exemplary embodiments of the present inventive concept described herein. Like reference numerals may refer to like elements throughout the specification and drawings.

FIG. 1 is a perspective view of a three-dimensional semiconductor memory device according to an exemplary embodiment of the present inventive concept.

Referring to FIG. 1, a three-dimensional semiconductor memory device may include a peripheral logic structure PS and a cell array structure CS. In an exemplary embodiment of the present inventive concept, the cell array structure CS may be stacked on the peripheral logic structure PS. For example, the peripheral logic structure PS and the cell array structure CS may be overlapped with each other, when viewed in a plan view. For example, a plurality of cell array structures CS may be stacked on a single peripheral logic structure.

In an exemplary embodiment of the present inventive concept, the peripheral logic structure PS may include row and column decoders, a page buffer, and control circuits, which are configured to control a memory cell array of the three-dimensional semiconductor memory device.

The cell array structure CS may include a plurality of memory blocks BLK1-BLKn, each of which is configured to independently perform an erase operation. Each of the memory blocks BLK1-BLKn may include a memory cell array, which may have a three-dimensional or vertical structure. The memory cell array may include a plurality of memory cells, which are three-dimensionally arranged, and a plurality of word and bit lines, which are electrically connected to the memory cells. The memory cell array having the three-dimensional structure will be described in more detail with reference to the drawings below.

Figure 2:
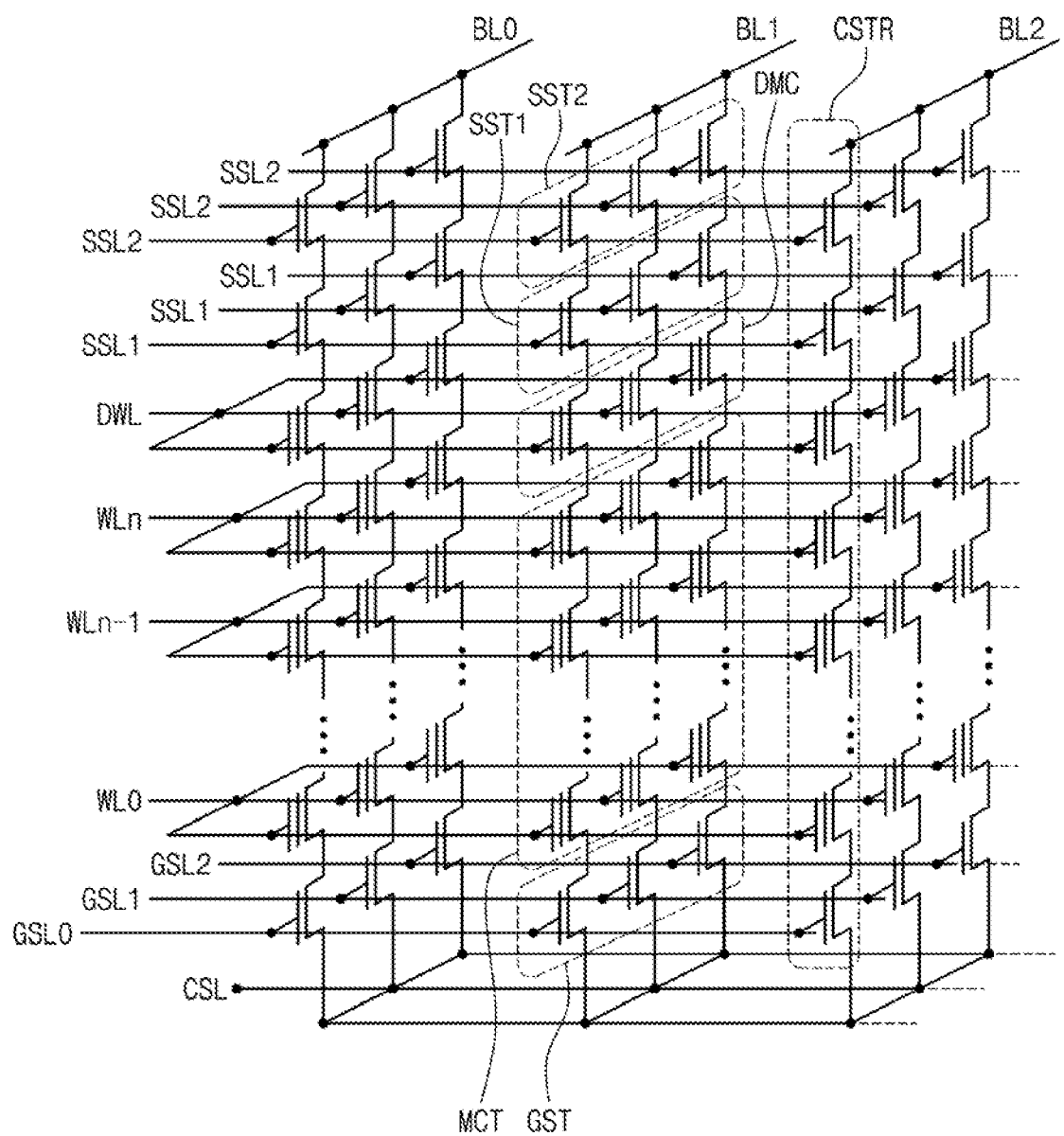
FIG. 2 is a circuit diagram of a memory cell array of a three-dimensional semiconductor memory device according to an exemplary embodiment of the present inventive concept.

FIG. 2 is a circuit diagram of a memory cell array of a three-dimensional semiconductor memory device according to an exemplary embodiment of the present inventive concept.

Referring to FIG. 2, a memory cell array of a semiconductor memory device may include a common source line CSL, a plurality of bit lines BL0-BL2, and a plurality of cell strings CSTR provided between the common source line CSL and the bit lines BL0-BL2.

The cell strings CSTR may be provided on a plane, which is parallel to first and second directions D1 and D2, and may extend in a third direction D3. The bit lines BL0-BL2 may be spaced apart from each other in the first direction D1 and may extend in the second direction D2.

As an example, the first direction D1 may be perpendicular to the second direction D2. The first direction D1 and the second direction D2 may define a plane along which the cell strings CSTR extend. The third direction 1D3 may be perpendicular to the first and second directions D1 and D2. Thus, the third direction D3 may be orthogonal to a plane extending in the first and second directions D1 and D2.

A plurality of the cell strings CSTR may be connected in parallel to each of the bit lines BL0-BL2. The plurality of the cell strings CSTR may be connected in common to the common source line CSL. As an example, the plurality of the cell strings CSTR may be provided between the bit lines BL0-BL2 and the common source line CSL. In an exemplary embodiment of the present inventive concept, a plurality of the common source lines CSL may be two-dimensionally arranged. The common source lines CSL may be applied with substantially the same voltage as each other or may be independently controlled (e.g., different voltages may be applied to the different common source lines CSL).

In an exemplary embodiment of the present inventive concept, each of the cell strings CSTR may include string selection transistors SST1 and SST2, which are connected in series to each other, memory cell transistors MCT, which are connected in series to each other, and a ground selection transistor GST. In addition, each of the memory cell transistors MCT may include a data storage element.

As an example, each of the cell strings CSTR may include first and second string selection transistors SST1 and SST2, which are connected in series to each other, the second string selection transistors SST2 may be coupled to the bit lines BL0-BL2, and the ground selection transistor GST may be coupled to the common source line CSL. The memory cell transistors MCT may be provided between, and connected in series to, the first string selection transistor SST1 and the ground selection transistor GST.

Each of the cell strings CSTR may further include a dummy cell transistor DMC, which is provided between and connected to the first string selection transistor SST1 and the memory cell transistor MCT. An additional dummy cell transistor may be further provided between and connected to the ground selection transistor GST and the memory cell transistor MCT. In an exemplary embodiment of the present inventive concept, in each of the cell strings CSTR, the ground selection transistor GST may include a plurality of metal-oxide-semiconductor (MOS) transistors, which are connected in series to each other, similar to the first and second string selection transistors SST1 and SST2. In an exemplary embodiment of the present inventive concept, each of the cell strings CSTR may be configured to include a single string selection transistor.

In an exemplary embodiment of the present inventive concept, the first string selection transistor SST1 may be controlled by a first string selection line SSL1, and the second string selection transistor SST2 may be controlled by a second string selection line SSL2. The memory cell transistors MCT may be controlled by a plurality of word lines WL0-WLn, and the dummy cell transistor DMC may be controlled by a dummy word line DWL. Furthermore, the ground selection transistors GST may be controlled by ground selection lines GSL0-GSL2. The common source line CSL may be connected in common to source regions of the ground selection transistors GST.

Gate electrodes of the memory cell transistors MCT, which are placed at substantially the same distance from the common source lines CSL, may be connected in common to one of the word lines WL0-WLn and DWL, thus being in an equipotential state. In an exemplary embodiment of the present inventive concept, some of the gate electrodes of the memory cell transistors MCT, which are placed at substantially the same level from the common source lines CSL to form different rows or column, may be independently controlled.

The ground selection lines GSL0-GSL2 and the string selection lines SSL1 and SSL2 may extend in the first direction D1 and may be spaced apart from each other in the second direction D2. Although the ground selection lines GSL0-GSL2 or the string selection lines SSL1 and SSL2 may be placed at substantially the same distance from the common source lines CSL, they may be electrically separated from each other.

Figure 3A:
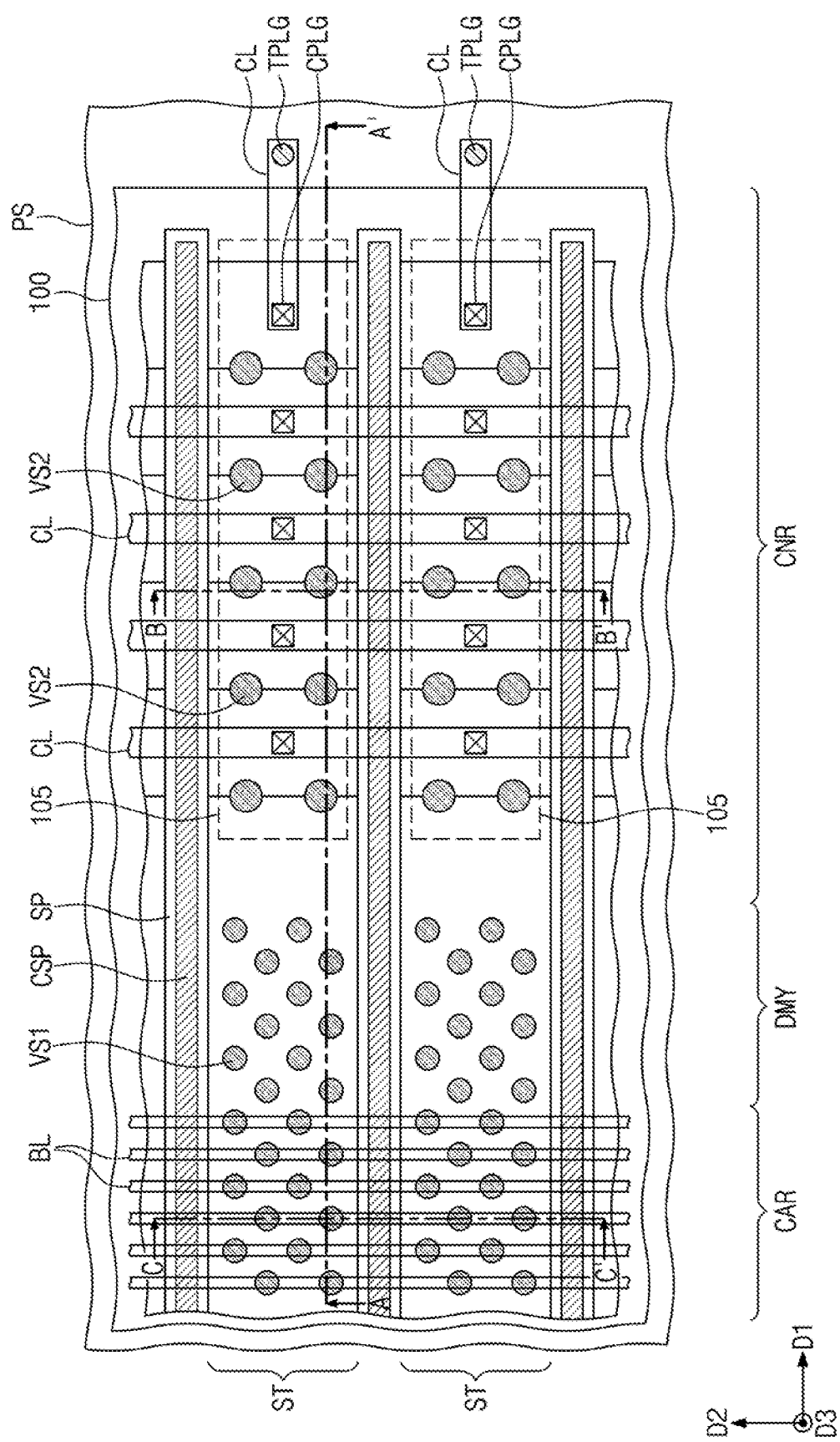
FIGS. 3A and 3B are plan views of a three-dimensional semiconductor memory device according to an exemplary embodiment of the present inventive concept.
Figure 3B:
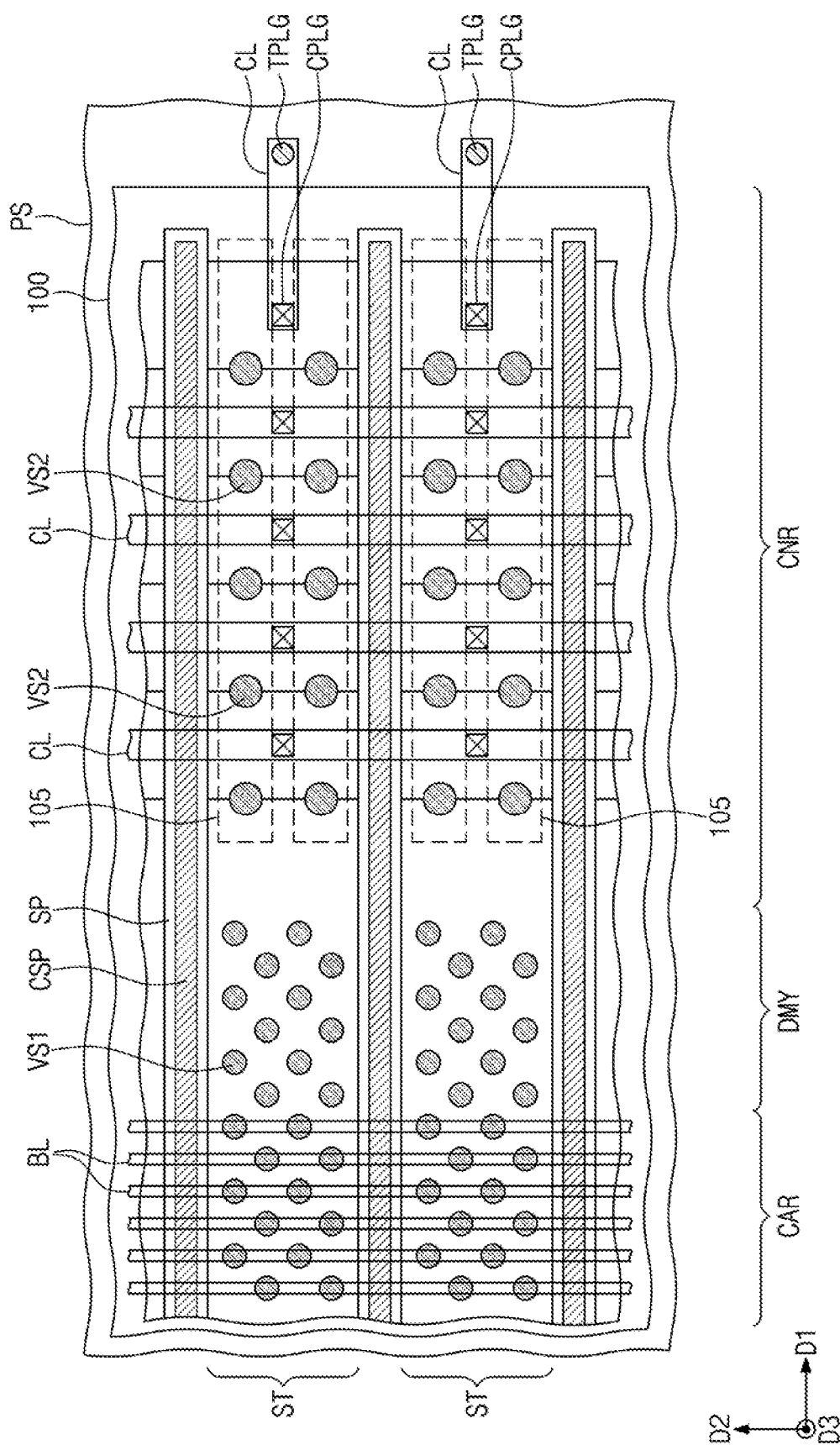
Figure 4A:
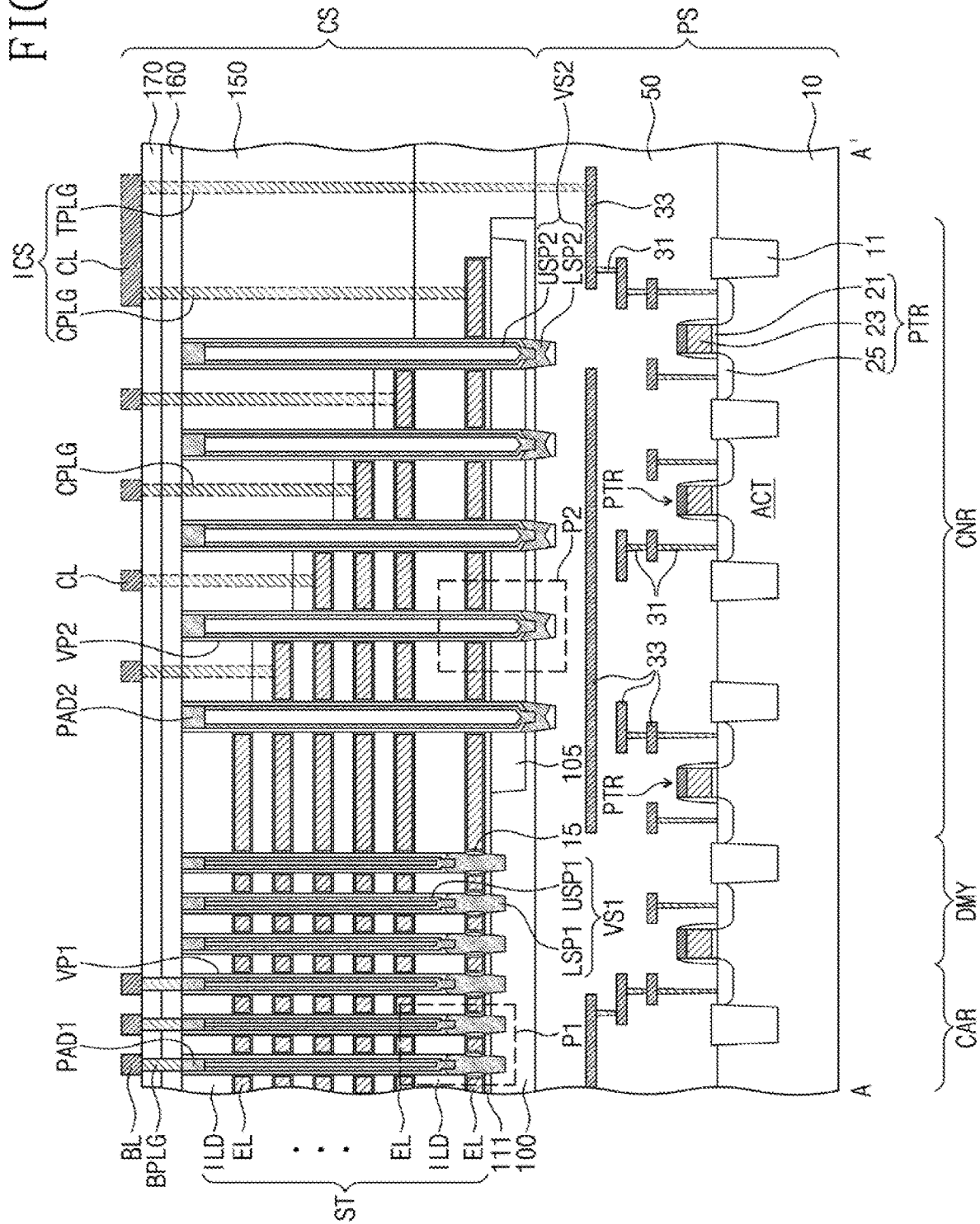
FIGS. 4A, 4B, and 4C are cross-sectional views taken along lines A-A', B-B', and C-C' of FIG. 3A.
Figure 4B:
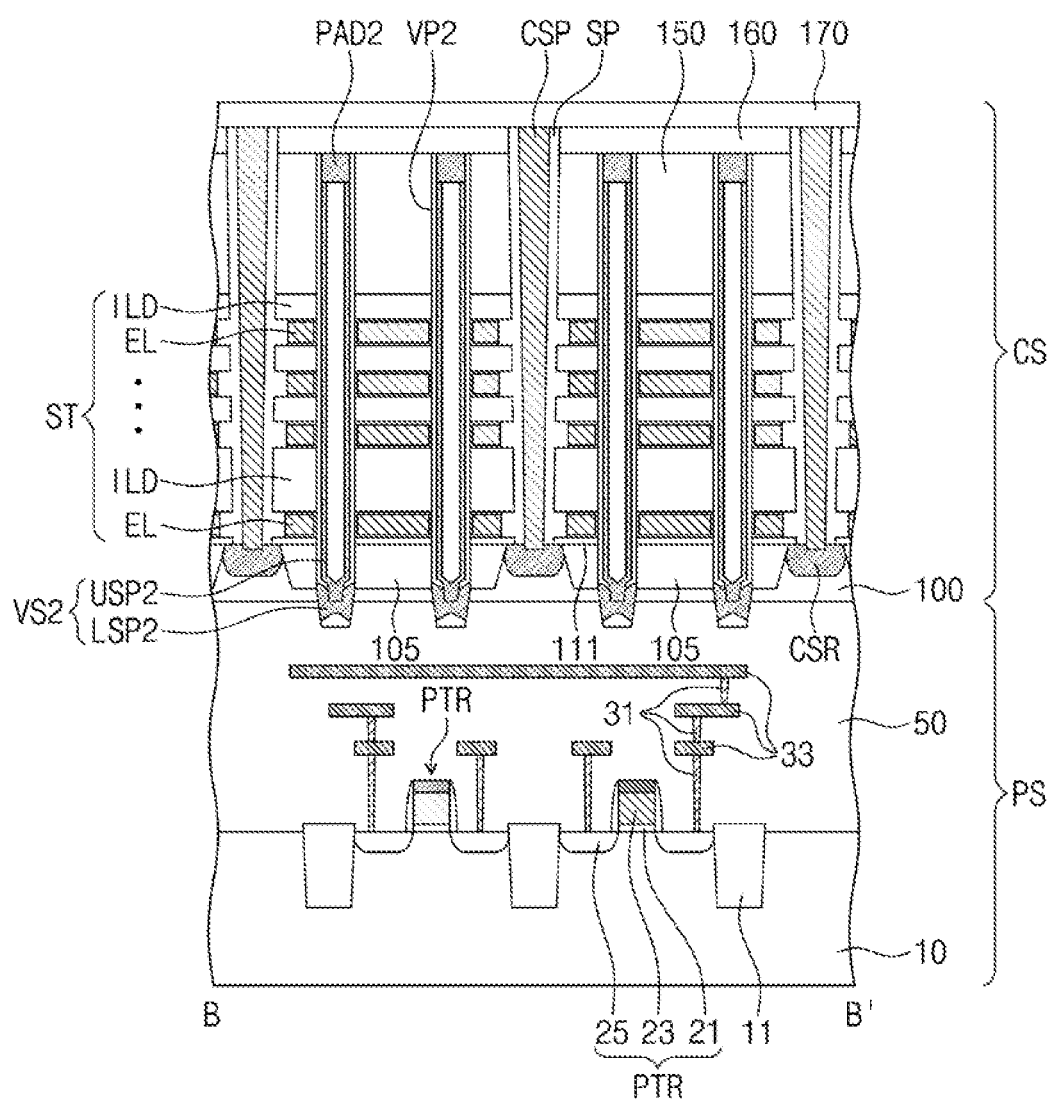
Figure 4C:
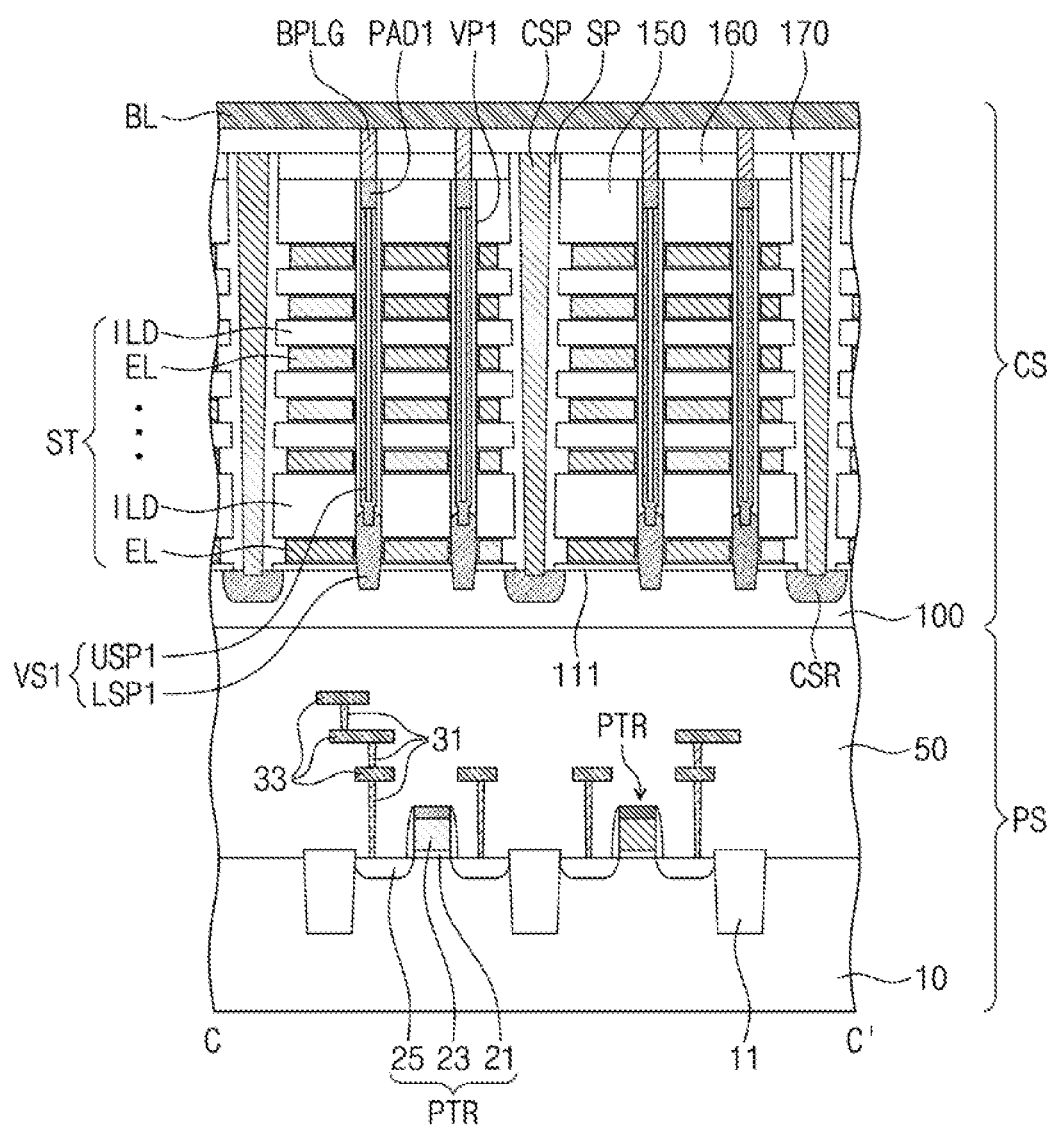
Figure 5A:
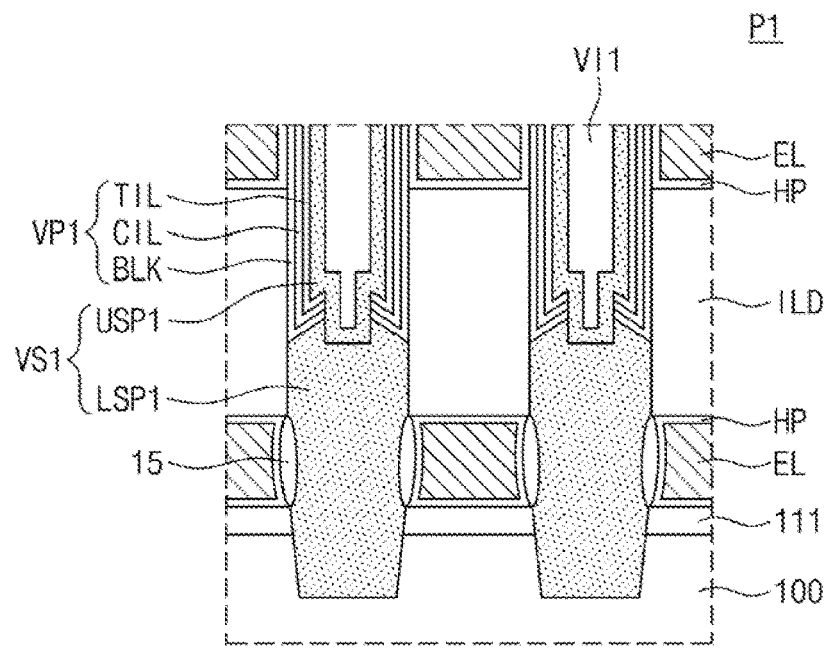
FIG. 5A is an enlarged cross-sectional view of a portion 'P1' of FIG. 4A.
Figure 5B:
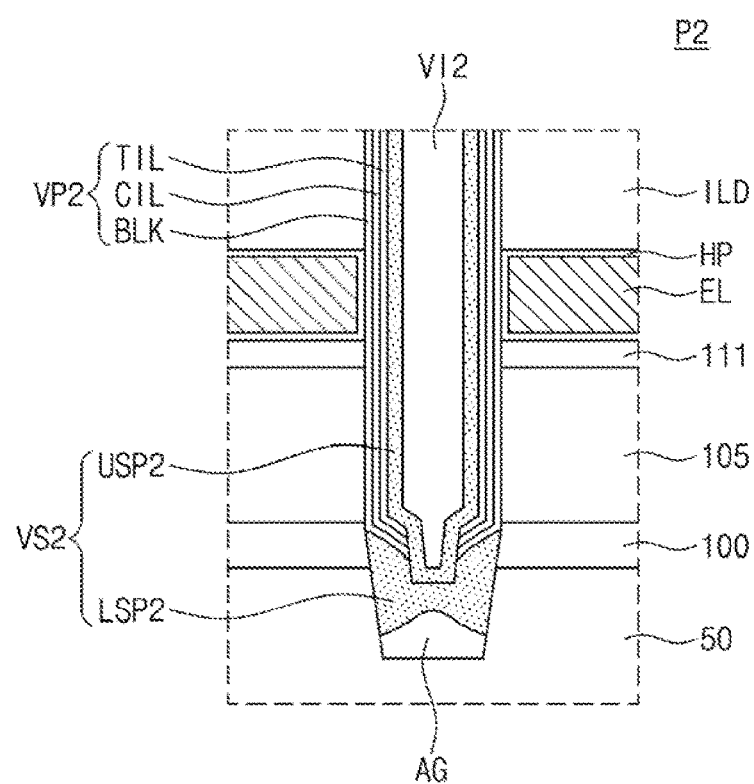
FIGS. 5B and 5C are enlarged cross-sectional views of a portion 'P2' of FIG. 4A.
Figure 5C:
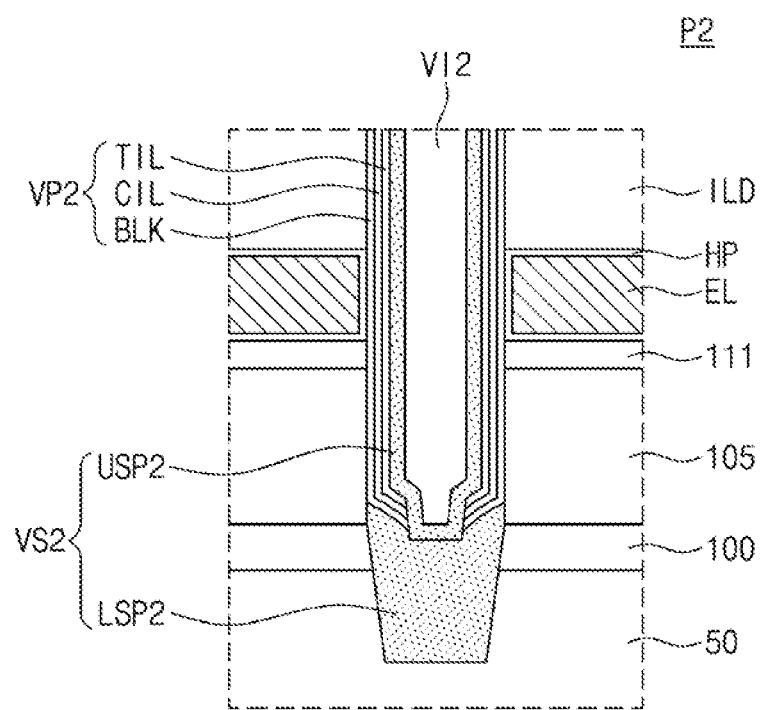

FIGS. 3A and 3B are plan views of a three-dimensional semiconductor memory device according to an exemplary embodiment of the present inventive concept. FIGS. 4A, 4B, and 4C are cross-sectional views taken along lines A-A', B-B', and C-C' of FIG. 3A. FIG. 5A is an enlarged cross-sectional view of a portion 'P1' of FIG. 4A. FIGS. 5B and 5C are enlarged cross-sectional views illustrating a portion 'P2' of FIG. 4A.

Referring to FIGS. 3A, 4A, 4B, and 4C, a three-dimensional semiconductor memory device may include the peripheral logic structure PS on a semiconductor substrate 10, the cell array structure CS on the peripheral logic structure PS, and a connection structure ICS, which is provided to penetrate a portion of the cell array structure CS and to connect the cell array structure CS to the peripheral logic structure PS.

In an exemplary embodiment of the present inventive concept, the peripheral logic structure PS may include peripheral logic circuits PTR. The peripheral logic circuits PTR may be disposed on a semiconductor substrate 10. For example, the peripheral logic circuits PTR may be integrated on the semiconductor substrate 10. A lower insulating layer 50 may be provided to cover the peripheral logic circuits PTR. For example, the lower insulating layer 50 may be disposed on upper and side surfaces of the peripheral logic circuits PTR.

The semiconductor substrate 10 may be a silicon substrate, a silicon-germanium substrate, a germanium substrate, or a single-crystalline epitaxial layer grown on a single-crystalline silicon substrate. The semiconductor substrate 10 may include active regions ACT defined by a device isolation layer 11.

The peripheral logic circuits PTR may include row and column decoders, a page buffer, and control circuits and may be configured to include NMOS and PMOS transistors, low and high voltage transistors, and resistors, which are integrated on a top surface of the semiconductor substrate 10. For example, the peripheral logic circuits PTR may include a peripheral gate insulating layer 21 on the semiconductor substrate 10, a peripheral gate electrode 23 on the peripheral gate insulating layer 21, and source/drain regions 25 at opposite sides of the peripheral gate electrode 23.

Peripheral circuit lines 33 may be electrically connected to the peripheral logic circuits PTR through peripheral contact plugs 31. For example, the peripheral contact plugs 31 and the peripheral circuit lines 33 may be connected to NMOS and PMOS transistors.

The lower insulating layer 50 may be provided on the top surface of the semiconductor substrate 10. The lower insulating layer 50 may be in direct contact with the semiconductor substrate 10. For example, the lower insulating layer 50 may be provided on the semiconductor substrate 10 to cover the peripheral logic circuits PTR, the peripheral contact plugs 31, and the peripheral circuit lines 33. The lower insulating layer 50 may include a plurality of vertically-stacked insulating layers. The lower insulating layer 50 may include, for example, a silicon oxide layer, a silicon nitride layer, a silicon oxynitride layer, and/or a low-k dielectric layer.

The cell array structure CS may be provided on the lower insulating layer 50 and may include a horizontal semiconductor layer 100, electrode structures ST, and cell and dummy vertical structures VS and DVS.

The horizontal semiconductor layer 100 may be provided on a top surface of the lower insulating layer 50. The horizontal semiconductor layer 100 may include a cell array region CAR, on which memory cells are provided, and a connection region CNR, on which the connection structure ICS connected to the memory cells is provided. The horizontal semiconductor layer 100 may include a dummy cell region DMY between the cell array region CAR and the connection region CNR.

The horizontal semiconductor layer 100 may include at least one of semiconductor materials (e.g., silicon (Si), germanium (Ge), silicon germanium (SiGe), gallium arsenide (GaAs), indium gallium arsenide (InGaAs), or aluminum gallium arsenide (AlGaAs)). In addition, the horizontal semiconductor layer 100 may be formed of or may include a doped semiconductor material of a first conductivity type or an intrinsic semiconductor material. Furthermore, the horizontal semiconductor layer 100 may have at least one of single- or poly-crystalline structures or an amorphous structure.

In an exemplary embodiment of the present inventive concept, the cell strings CSTR of FIG. 2 may be integrated on the horizontal semiconductor layer 100. The electrode structures ST and first vertical structures VS1 may form the cell strings CSTR described with reference to FIG. 2.

Dummy insulating patterns 105 may be provided in the connection region CNR of the horizontal semiconductor layer 100. The dummy insulating patterns 105 may be provided to have bottom surfaces spaced apart from a bottom surface of the horizontal semiconductor layer 100. For example, the bottom surfaces of the dummy insulating patterns 105 may be spaced apart from the top surface of the lower insulating layer 50. As an example, the bottom surfaces of the dummy insulating patterns 105 may be located between the top and bottom surfaces of the horizontal semiconductor layer 100. The dummy insulating patterns 105 may include an insulating material (e.g., silicon oxide). The dummy insulating patterns 105 may be a line-shaped structure extending in the first direction D1 and may be spaced apart from each other in the second direction D2 (see, e.g., FIGS. 3A and 3B).

A buffer insulating layer 111 may be provided on the top surface of the horizontal semiconductor layer 100, and the electrode structures ST may be provided on the buffer insulating layer 111. The electrode structures ST on the horizontal semiconductor layer 100 may extend in the first direction D1 and may be spaced apart from each other in the second direction D2. Each of the electrode structures ST may include electrodes EL, which are stacked (e.g., vertically stacked) on the horizontal semiconductor layer 100, and the insulating layers ILD may be disposed between the electrodes EL.

The electrode structures ST may be provided to have a staircase structure on the connection region CNR. For example, lengths of the electrodes EL in the first direction D1 may decrease with increasing distance from the horizontal semiconductor layer 100, and heights of the electrode structures ST may decrease with increasing distance from the cell array region CAR. In addition, when viewed in a plan view (e.g., along the third direction D3), side surfaces of the electrodes EL may be spaced apart from each other, by a substantially constant distance, in the first direction D1. Each of the electrodes EL may have a pad portion located on the connection region CNR, and the pad portions of the electrodes EL may be spaced apart from each other in horizontal and vertical directions. In addition, the pad portions of the electrodes EL may be stacked to form a staircase structure.

The electrodes EL of the electrode structure ST may be used as control gate electrodes of the memory cell transistors MCT described with reference to FIG. 2. For example, the electrodes EL may be used as the ground selection lines GSL0-GSL2, the word lines WL0-WLn and DWL, and the string selection lines SSL1 and SSL2 described with reference to FIG. 2.

In an exemplary embodiment of the present inventive concept, the electrode structures ST may be extended onto the dummy insulating patterns 105. For example, the dummy insulating patterns 105 may be positioned below the staircase structure of the electrode structures ST. The dummy insulating patterns 105 may be overlapped with the electrode structures ST, when viewed in a plan view (e.g., along the third direction D3). When measured in the second direction D2, widths of the dummy insulating patterns 105 may be smaller than a width of each of the electrode structures ST. In an exemplary embodiment of the present inventive concept, when measured in the second direction D2, the widths of the dummy insulating patterns 105 may be larger than the width of each of the electrode structures ST. Each of the dummy insulating patterns 105 may be provided below a corresponding one of the electrode structures ST (see, e.g., FIG. 3A). In an exemplary embodiment of the present inventive concept, a pair of the dummy insulating patterns 105 extending in the first direction D1 may be provided below each of the electrode structures ST (see, e.g., FIG. 3B).

A planarized insulating layer 150 may be provided on the top surface of the horizontal semiconductor layer 100. The planarized insulating layer 150 may cover the electrode structures ST. The planarized insulating layer 150 may cover the staircase structure of the electrode structures ST, on the connection region CNR and may have a substantially flat top surface. The planarized insulating layer 150 may include a single insulating layer or a plurality of stacked insulating layers. The planarized insulating layer 150 may be formed of or include at least one of, for example, silicon oxide or low-k dielectric materials.

A plurality of the first vertical structures VS1 may be provided to penetrate each of the electrode structures ST, on the cell array region CAR and the dummy cell region DMY, and may be connected to the horizontal semiconductor layer 100. When viewed in a plan view (e.g., along the third direction D3), the first vertical structures VS1 may be provided to form a zigzag arrangement in the first direction D1. The first vertical structures VS1 may be formed of or include at least one of semiconductor materials (e.g., silicon (Si) or germanium (Ge)). In an exemplary embodiment of the present inventive concept, the first vertical structures VS1 may be formed of or include a doped semiconductor material or an intrinsic semiconductor material. The first vertical structures VS1 including the semiconductor material may be used as channel regions of the string and ground selection transistors SST and GST and the memory cell transistors MCT described with reference to FIG. 2.

In an exemplary embodiment of the present inventive concept, each of the first vertical structures VS1 may include a first lower semiconductor pattern LSP1 and a first upper semiconductor pattern USP1. For example, referring to FIGS. 4A, 4C, and 5A, the first lower semiconductor pattern LSP1 may be in direct contact with the horizontal semiconductor layer 100 and may include a pillar-shaped epitaxial layer grown from the horizontal semiconductor layer 100.

The first lower semiconductor pattern LSP1 may be formed of or include at least one of silicon (Si), germanium (Ge), silicon-germanium (SiGe), III-V semiconductor compounds, and/or II-VI semiconductor compounds. The first lower semiconductor pattern LSP1 may be an undoped pattern or may be a doped pattern that is doped to have the same conductivity type as that of the horizontal semiconductor layer 100.

The first lower semiconductor pattern LSP1 may have a first height in the third direction D3, and the first height may be larger than a thickness of the lowermost one of the electrodes EL. The first lower semiconductor pattern LSP1 may have a top surface that is positioned at a level higher than a top surface of the lowermost one of the electrodes EL of the electrode structure ST. The top surface of the first lower semiconductor pattern LSP1 may be positioned below a top surface of the lowermost insulating layer ILD provided on the lowermost one of the electrodes EL. A bottom surface of the first lower semiconductor pattern LSP1 may be positioned at a level that is lower than a bottom surface of the lowermost one of the electrodes EL and is higher than the bottom surfaces of the dummy insulating patterns 105.

A gate insulating layer 15 may be provided on a portion of a side surface of the first lower semiconductor pattern LSP1. The gate insulating layer 15 may be provided between the lowermost one of the electrodes EL and the first lower semiconductor pattern LSP1. The gate insulating layer 15 may include a silicon oxide layer (e.g., a thermally-grown oxide layer). The gate insulating layer 15 may have a rounded side surface.

The first upper semiconductor pattern USP1 may be in direct contact with the first lower semiconductor pattern LSP1 and may have a bottom-closed pipe or a 'U'-shape. As an example, the first upper semiconductor pattern USP1 may include a protrusion penetrating an upper portion of the first lower semiconductor pattern LSP1 (see, e.g., FIG. 4C). An internal space of the first upper semiconductor pattern USP1 may be substantially filled with a first insulating gapfill pattern VI1 including an insulating material.

The first upper semiconductor pattern USP1 may have a bottom surface positioned at a level lower than that the top surface of the first lower semiconductor pattern LSP1. The first upper semiconductor pattern USP1 may be formed of or include an undoped semiconductor material or a doped semiconductor material having substantially the same conductivity type as that of the horizontal semiconductor layer 100. The first upper semiconductor pattern USP1 may have a different crystal structure from that of the first lower semiconductor pattern LSP1 and may have at least one of, for example, single-crystalline, poly-crystalline, or amorphous structures. A bit-line conductive pad PAD1, which is coupled with a bit line contact plug BPLG, may be provided on a top portion of the first vertical structure VS1 (e.g., a top portion of the first upper semiconductor pattern USP1).

A first vertical insulating pattern VP1 may be provided between the electrode structure ST and the first upper semiconductor pattern USP1. The first vertical insulating pattern VP1 may extend in the third direction D3 and may surround the side surface of the first upper semiconductor pattern USP1. For example, the first vertical insulating pattern VP1 may be in direct contact with side surfaces of the first upper semiconductor pattern USP1. As an example, the first vertical insulating pattern VP1 may be shaped like a pipe or macaroni with opened top and bottom portions.

As an example, referring to FIGS. 4A, 4C, and 5A, the first vertical insulating pattern VP1 may be in direct contact with a portion of the top surface of the first lower semiconductor pattern LSP1. A bottom surface of the first vertical insulating pattern VP1 may be positioned at a level higher than the bottom surface of the first upper semiconductor pattern USP1.

The first vertical insulating pattern VP may include a single layer or multiple layers. In an exemplary embodiment of the present inventive concept, the first vertical insulating pattern VP1 may include a tunnel insulating layer TIL, a charge storing layer CIL, and a blocking insulating layer BLK and may be used as a data storing layer of a NAND FLASH memory device. For example, the charge storing layer CIL may be a trap insulating layer, a floating gate electrode, or an insulating layer with conductive nano dots. For example, the charge storing layer CIL may include at least one of a silicon nitride layer, a silicon oxynitride layer, a silicon-rich nitride layer, a nanocrystalline silicon layer, or a laminated trap layer. The tunnel insulating layer TIL may include at least one of materials, whose band gaps are greater than the charge storing layer CIL, and the blocking insulating layer BLK may include a high-k dielectric material (e.g., aluminum oxide or hafnium oxide). In an exemplary embodiment of the present inventive concept, the first vertical insulating pattern VP1 may be used as a memory element of a phase-change or variable-resistance memory and may include a phase-change or variable-resistance layer.

A plurality of second vertical structures VS2 may be provided on the connection region CNR to penetrate the planarized insulating layer 150, the electrode structures ST, and the dummy insulating patterns 105. Bottom surfaces of the second vertical structures VS2 may be positioned at a level that is lower than the bottom surfaces of the first vertical structures VS1 and is lower than the bottom surface of the horizontal semiconductor layer 100. As an example, the bottom surfaces of the second vertical structures VS2 may be positioned in the lower insulating layer 50. The second vertical structures VS2 may be formed of or include the same semiconductor material as the first vertical structures VS1.

As an example, the second vertical structures VS2 may be provided to penetrate the staircase structure of the electrode structure ST, and the number of the electrodes EL, which are intersected with the second vertical structures VS2, may decrease with increasing distance between the second vertical structure VS2 and the cell array region CAR. The second vertical structures VS2 may be arranged in the first and second directions D1 and D2, when viewed in a plan view (e.g., along the third direction D3), and may penetrate side walls or pad portions of the electrodes EL on the connection region CNR. The second vertical structures VS2 may be provided to penetrate the dummy insulating patterns 105 and may be connected to the horizontal semiconductor layer 100. In the case where, the dummy insulating patterns 105 are line-shaped patterns (see, e.g., FIGS. 3A and 3B), a plurality of the second vertical structures VS2 arranged in the first direction D1 may be provided to penetrate one of the dummy insulating patterns 105 and may be connected to the horizontal semiconductor layer 100. Referring to FIGS. 3A and 4B, when measured in the second direction D2, a distance between the second vertical structures VS2 may be smaller than a width of the dummy insulating pattern 105.

Each of the second vertical structures VS2 may include a second lower semiconductor pattern LSP2 and a second upper semiconductor pattern USP2. When measured in the third direction D3, the second lower semiconductor pattern LSP2 may have a second height that is smaller than a first height of the first lower semiconductor pattern LSP1. For example, referring to FIGS. 4A, 4B, 4C, and 5B, a top surface of the second lower semiconductor pattern LSP2 may be positioned at a level lower than a bottom surface of the lowermost one of the electrodes EL of the electrode structure ST. The second lower semiconductor pattern LSP2 may include the same epitaxial layer as the first lower semiconductor pattern LSP1. A bottom surface of the second lower semiconductor pattern LSP2 may be positioned at a level lower than the bottom surface of the horizontal semiconductor layer 100 and may be spaced apart from the peripheral circuit lines 33. The second lower semiconductor pattern LSP2 may have a non-flat bottom surface. For example, the non-flat bottom surface may be curved or 'C' shaped. A portion of a side surface of the second lower semiconductor pattern LSP2 may be in direct contact with a portion of the horizontal semiconductor layer 100 between the dummy insulating pattern 105 and the lower insulating layer 50. Referring to FIG. 5B, an air gap AG may be defined between the bottom surface of the second lower semiconductor pattern LSP2 and the lower insulating layer 50. In an exemplary embodiment of the present inventive concept, referring to FIG. 5C, the bottom surface of the second lower semiconductor pattern LSP2 may be in direct contact with the lower insulating layer 50.

The second upper semiconductor pattern USP2 may be in direct contact with the second lower semiconductor pattern LSP2 and may have a bottom-closed pipe or a 'U'-shape. An internal space of the second upper semiconductor pattern USP2 may be substantially filled with a second insulating gapfill pattern VI2 including an insulating material. The second upper semiconductor pattern USP2 may have a bottom surface, which is positioned below that of the lowermost one of the electrodes EL and is positioned at a level lower than the top surface of the second lower semiconductor pattern LSP2. The second upper semiconductor pattern USP2 may be formed of or include the same semiconductor material as the first upper semiconductor pattern USP1. A dummy conductive pad PAD2 may be provided in top portions of the second vertical structures VS2 and may have substantially the same structure as the bit-line conductive pad PAD1.

Referring to FIG. 5B, the bottom surface of the second upper semiconductor pattern USP2 may be positioned at a level lower than the bottom surface of the horizontal semiconductor layer 100. Referring to FIG. 5C, the bottom surface of the second upper semiconductor pattern USP2 may be positioned at a level higher than the bottom surface of the horizontal semiconductor layer 100.

A second vertical insulating pattern VP2 may be provided between the electrode structure ST and the second upper semiconductor pattern USP2. The second vertical insulating pattern VP2 may extend in the third direction D3 and between the dummy insulating pattern 105 and the second upper semiconductor pattern USP2. As an example, a portion of the side surface of the second vertical insulating pattern VP2 may be in direct contact with the dummy insulating pattern 105. The second vertical insulating pattern VP2 may be shaped like a pipe or macaroni with opened top and bottom portions, similar to the first vertical insulating pattern VP1.

As an example, referring to FIGS. 4A, 4B, 4C, and 5B, the second vertical insulating pattern VP2 may be in direct contact with a portion of the top surface of the second lower semiconductor pattern LSP2. A bottom surface of the second vertical insulating pattern VP2 may be positioned below the bottom surface of the lowermost one of the electrodes EL and may be positioned below a top surface of the dummy insulating pattern 105.

The second vertical insulating pattern VP2 may include a single layer or multiple layers. In an exemplary embodiment of the present inventive concept, the second vertical insulating pattern VP2 may include the tunnel insulating layer TIL, the charge storing layer CIL, and the blocking insulating layer BLK and may be used as a data storing layer of a NAND FLASH memory device.

Referring to FIGS. 5A and 5B, a horizontal insulating pattern HP may be provided between side surfaces of the electrodes EL and the first vertical insulating pattern VP1 and between the side surfaces of the electrodes EL and the second vertical insulating pattern VP2. The horizontal insulating pattern HP may be extended from the side surfaces of the electrodes EL to cover the top and bottom surfaces of the electrodes EL. The horizontal insulating pattern HP may include a portion that is placed between the gate insulating layer 15 and the lowermost one of the electrodes EL, and another portion, which is extended from the portion to cover the top and bottom surfaces of the lowermost one of the electrodes EL. Thus, horizontal insulating patterns HP disposed on respective electrodes EL may be in direct contact with the first vertical insulating pattern, the gate insulating layer 15 or the second vertical insulating pattern depending on the respective electrode EL on which a particular horizontal insulating pattern HP is disposed. The horizontal insulating pattern HP may include a charge storing layer and a blocking insulating layer, which are used as a part of a data storing layer of a NAND FLASH memory device. In an exemplary embodiment of the present inventive concept, the horizontal insulating pattern HP may include a blocking insulating layer.

In an exemplary embodiment of the present inventive concept, the gate insulating layer 15 and a portion of the horizontal insulating pattern HP may be provided between the lowermost one of the electrodes EL and the first lower semiconductor pattern LSP1 on the cell array region CAR. A portion of the second vertical insulating pattern VP2 and a portion of the horizontal insulating pattern HP may be provided between the lowermost one of the electrodes EL and the second upper semiconductor pattern USP2, on the connection region CNR. As an example, a distance between the side surface of the lowermost one of the electrodes EL and the second upper semiconductor pattern USP2 on the connection region CNR may be different from the distance between the side surface of the lowermost one of the electrodes EL and the first lower semiconductor pattern LSP1 on the cell array region CAR. In an exemplary embodiment of the present inventive concept, since a portion of the second vertical insulating pattern VP2 having a substantially uniform thickness may be provided between the lowermost one of the electrodes EL and the second upper semiconductor pattern USP2, it may be possible to electrically separate the second upper semiconductor pattern USP2 from the lowermost one of the electrodes EL.

Referring to FIGS. 3A, 4A, 4B, and 4C, common source regions CSR may be provided between adjacent ones of the electrode structures ST and in the horizontal semiconductor layer 100. The common source regions CSR may extend parallel to the electrode structures ST and in the first direction D1. The common source regions CSR may be formed by doping the horizontal semiconductor layer 100 with impurities of a second conductivity type. The common source regions CSR may include, for example, n-type impurities (e.g., arsenic (As) or phosphorus (P)).

A first interlayered insulating layer 160 may be provided on the planarized insulating layer 150 to cover the top surfaces of the first and second vertical structures VS1 and VS2. The first interlayered insulating layer 160 may be in direct contact with the planarized insulating layer 150.

A common source plug CSP may be coupled to a common source region CSR between the electrode structures ST. As an example, the common source plug CSP may extend in the first direction D1 and may have a substantially uniform upper width. As an example, an insulating spacer SP may be disposed between the common source plug CSP and side surfaces of the electrode structures ST. Alternatively, the common source plug CSP may be provided to penetrate the insulating spacer SP and may be locally coupled to the common source region CSR.

A second interlayered insulating layer 170 may be provided on the first interlayered insulating layer 160. The second interlayered insulating layer 170 may cover a top surface of the common source plug CSP. The second interlayered insulating layer 170 may be in direct contact with the first interlayer insulating layer 160. Bit lines BL may be provided on the second interlayered insulating layer 170 and on the cell array region CAR and may extend in the second direction D2. The bit lines BL may be electrically connected to the first vertical structures VS1 through the bit line contact plugs BPLG.

Cell contact plugs CPLG may be provided on the connection region CNR to penetrate the first and second interlayered insulating layers 160 and 170 and the planarized insulating layer 150 and may be coupled to respective pad portions of the electrodes EL. Vertical lengths of the cell contact plugs CPLG may decrease with decreasing distance from the cell array region CAR (e.g., along the first direction D1 moving toward the connection region CNR). Top surfaces of the cell contact plugs CPLG may be substantially coplanar with each other.

Penetration plugs TPLG may penetrate the first and second interlayered insulating layers 160 and 170, the planarized insulating layer 150, and the lower insulating layer 50 and may be connected to the peripheral circuit lines 33. As an example, the penetration plug TPLG may be positioned in the connection region and may have a vertical length longer than that of the cell contact plugs CPLG.

Connection lines CL may be provided on the second interlayered insulating layer 170 of the connection region CNR, and the connection lines CL may connect the cell contact plugs CPLG to the penetration plugs TPLG. For example, a cell contact plug of a plurality of cell contact plugs CPLG may be connected with a penetration plug TPLG, while other contact plugs of the plurality of cell contact plugs CPLG might not be connected with a penetration plug TPLG.

Figure 13:
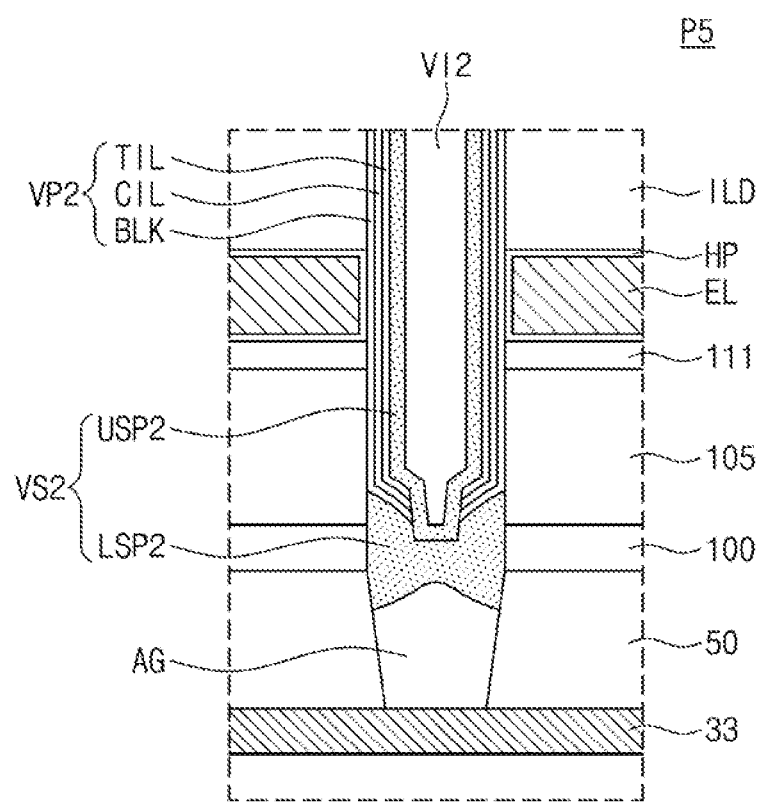
FIG. 13 is an enlarged cross-sectional view of a portion 'P5' of FIG. 12.
Figure 14:
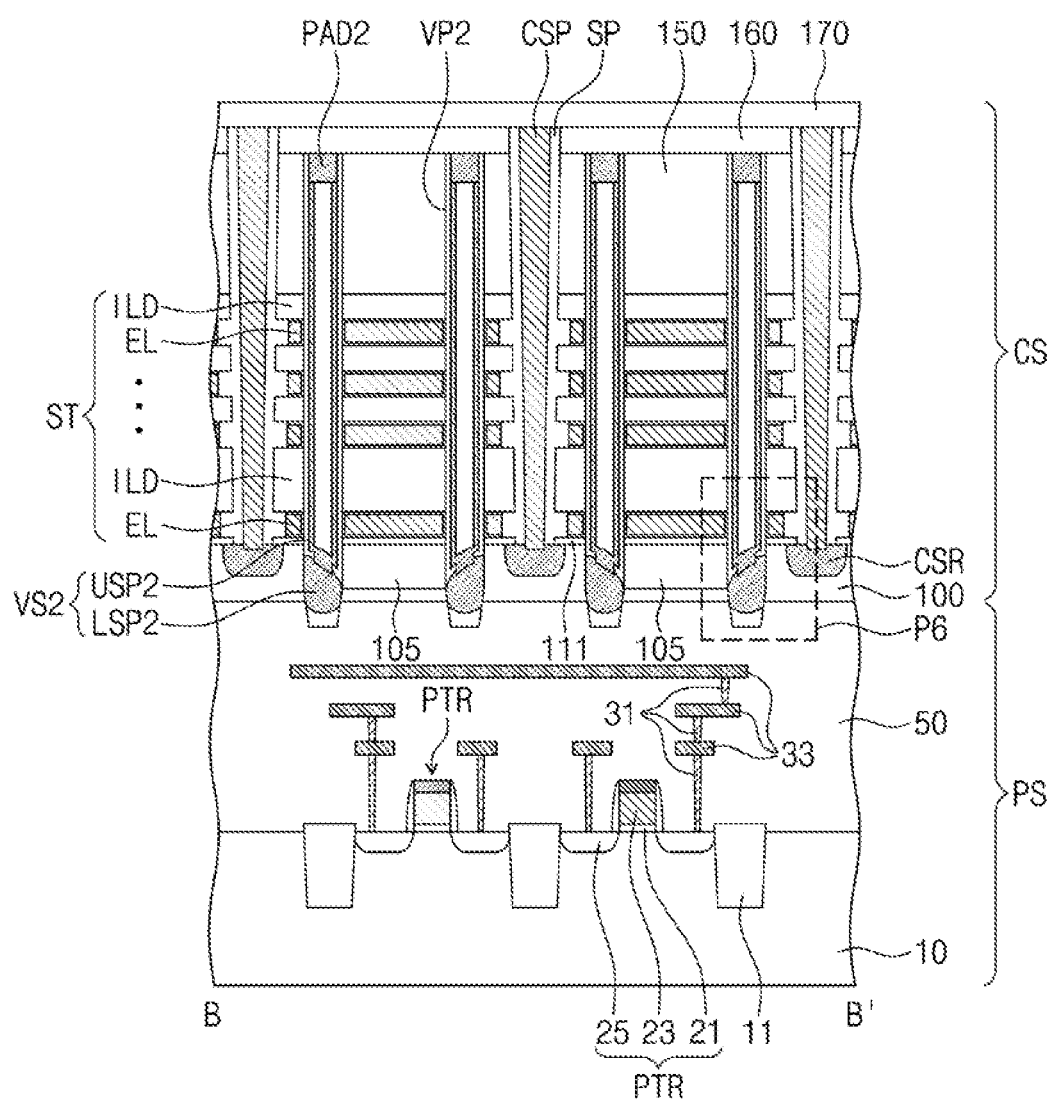
Figure 15:
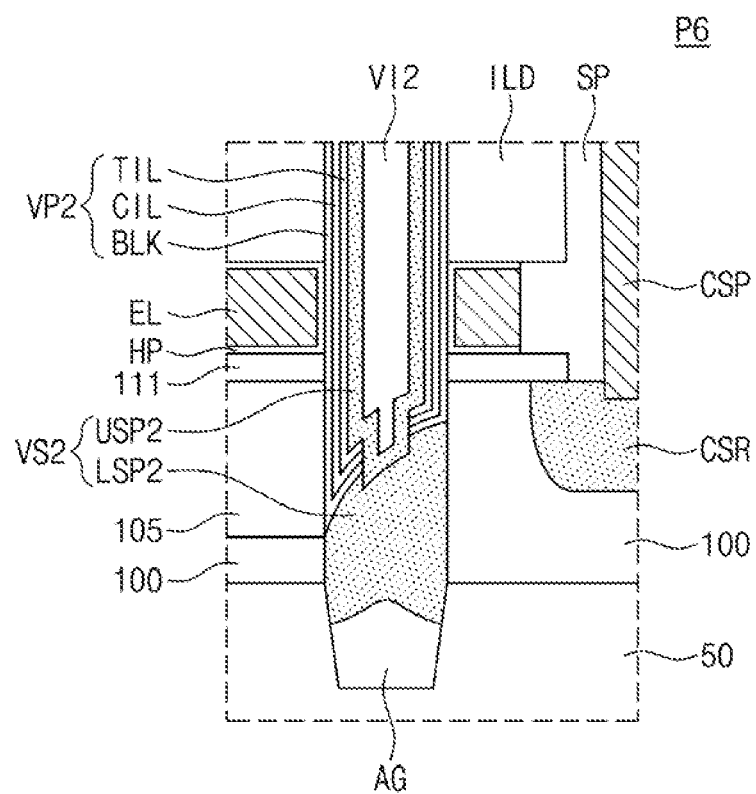
FIG. 15 is an enlarged cross-sectional view of a portion 'P6' of FIG. 14.

FIGS. 6 to 8, 10, 12, and 14 are cross-sectional views, each of which is taken along line A-A' of FIG. 3A, of a three-dimensional semiconductor memory device according to an exemplary embodiment of the present inventive concept. FIG. 9 is an enlarged cross-sectional view of a portion 'P3' of FIG. 8. FIG. 11 is an enlarged cross-sectional view of a portion 'P4' of FIG. 10. FIG. 13 is an enlarged cross-sectional view of a portion 'P5' of FIG. 12. FIG. 14 is a cross-sectional view, which is taken along line B-B' of FIG. 3A, of a three-dimensional semiconductor memory device according to an exemplary embodiment of the present inventive concept. FIG. 15 is an enlarged cross-sectional view of a portion 'P6' of FIG. 14.

Descriptions of components, layers or regions which are the same or substantially the same as those described above may be omitted below.

Figure 6:
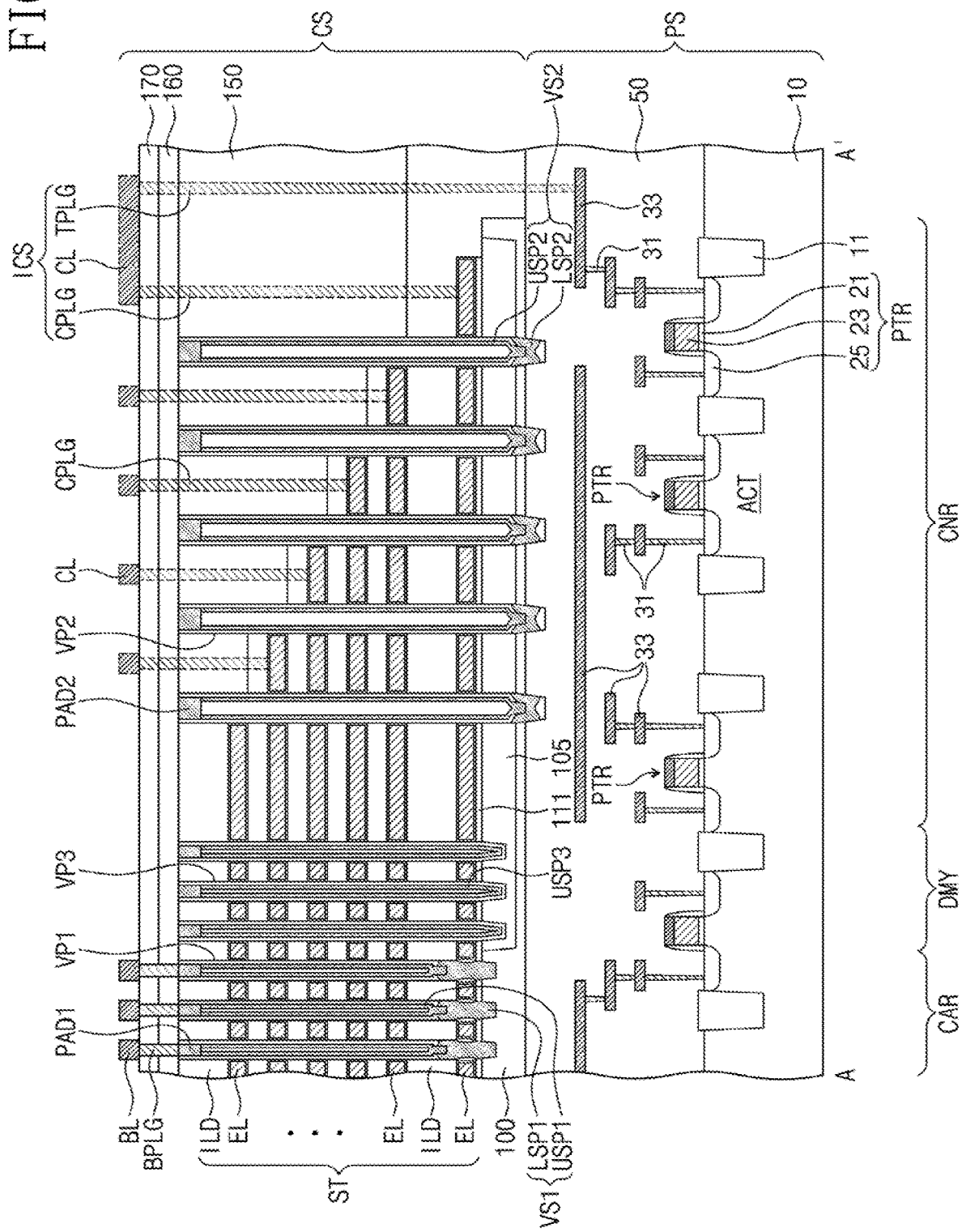
FIGS. 6 to 8, 10, 12, and 14 are cross-sectional views, each of which is taken along line A-A' of FIG. 3A, of a three-dimensional semiconductor memory device according to an exemplary embodiment of the present inventive concept.

Referring to FIG. 6, the dummy insulating pattern 105 may be extended from the connection region CNR to the dummy cell region DMY. In an exemplary embodiment of the present inventive concept, a third upper semiconductor patterns USP3 may be provided on the dummy cell region DMY to penetrate the electrode structure ST and may have bottom surfaces that are positioned in the dummy insulating pattern 105. For example, the third upper semiconductor patterns USP3 may be spaced apart from the horizontal semiconductor layer 100. The bottom surfaces of the third upper semiconductor patterns USP3 may be positioned at a level that is lower than the bottom surfaces of the first vertical structures VS1 and is higher than the bottom surfaces of the second vertical structures VS2. The third upper semiconductor patterns USP3 may be formed of or include the same semiconductor material as the first and second upper semiconductor patterns USP1 and USP2.

Third vertical insulating patterns VP3 may be provided between the third upper semiconductor patterns USP3 and the electrode structure ST and may be extended into a region between the dummy insulating pattern 105 and the bottom surface of the third upper semiconductor pattern USP3. The third vertical insulating patterns VP3 may be formed of or include the same material as the first and second vertical insulating patterns VP1 and VP2.

According to an exemplary embodiment of the present inventive concept, a three-dimensional semiconductor memory device may include the semiconductor substrate 10 and the lower insulating layer 50 disposed on the semiconductor substrate 10. The horizontal semiconductor layer 100 may be disposed on the lower insulating layer 50. The dummy insulating pattern 105 may be formed in the horizontal semiconductor layer 100. The electrode structure ST may be disposed on the horizontal semiconductor layer 100. The electrode structure ST may include a plurality of electrodes (e.g., electrodes EL) and a plurality of insulating layers (e.g., insulating layers ILD) that are alternately and repeatedly stacked. A plurality of first vertical structures (e.g., first vertical structures VS1) may penetrate the electrode structure ST. Bottom surfaces of the first vertical structures may be positioned between an upper surface of the horizontal semiconductor layer 100 and a lower surface of the horizontal semiconductor layer 100. A plurality of second vertical structures (e.g., second vertical structures VS2) may penetrate the electrode structure ST and the dummy insulating pattern 105. Bottom surfaces of the second vertical structures may be positioned below the bottom surface of the horizontal semiconductor layer 100. Thus, bottom surfaces of the first vertical structures may be positioned above bottom surfaces of the second vertical structures.

A bottom surface of the first vertical structure (e.g., VS1) of the plurality of first vertical structures may be positioned between an upper surface of the dummy insulating pattern 105 and a bottom surface of the dummy insulating pattern 105.

The first vertical structure (e.g., VS1) of the plurality of first vertical structures may include the vertical insulating pattern VP3 disposed on side and bottom surfaces of the first vertical structure of the plurality of first vertical structures. A bottom surface of the vertical insulating pattern VP3 may be positioned between the upper surface of the dummy insulating pattern 105 and the bottom surface of the dummy insulating pattern 105. Thus, the dummy insulating pattern 105 may be in direct contact with side and bottom surfaces of the vertical insulating pattern VP3.

Figure 7:
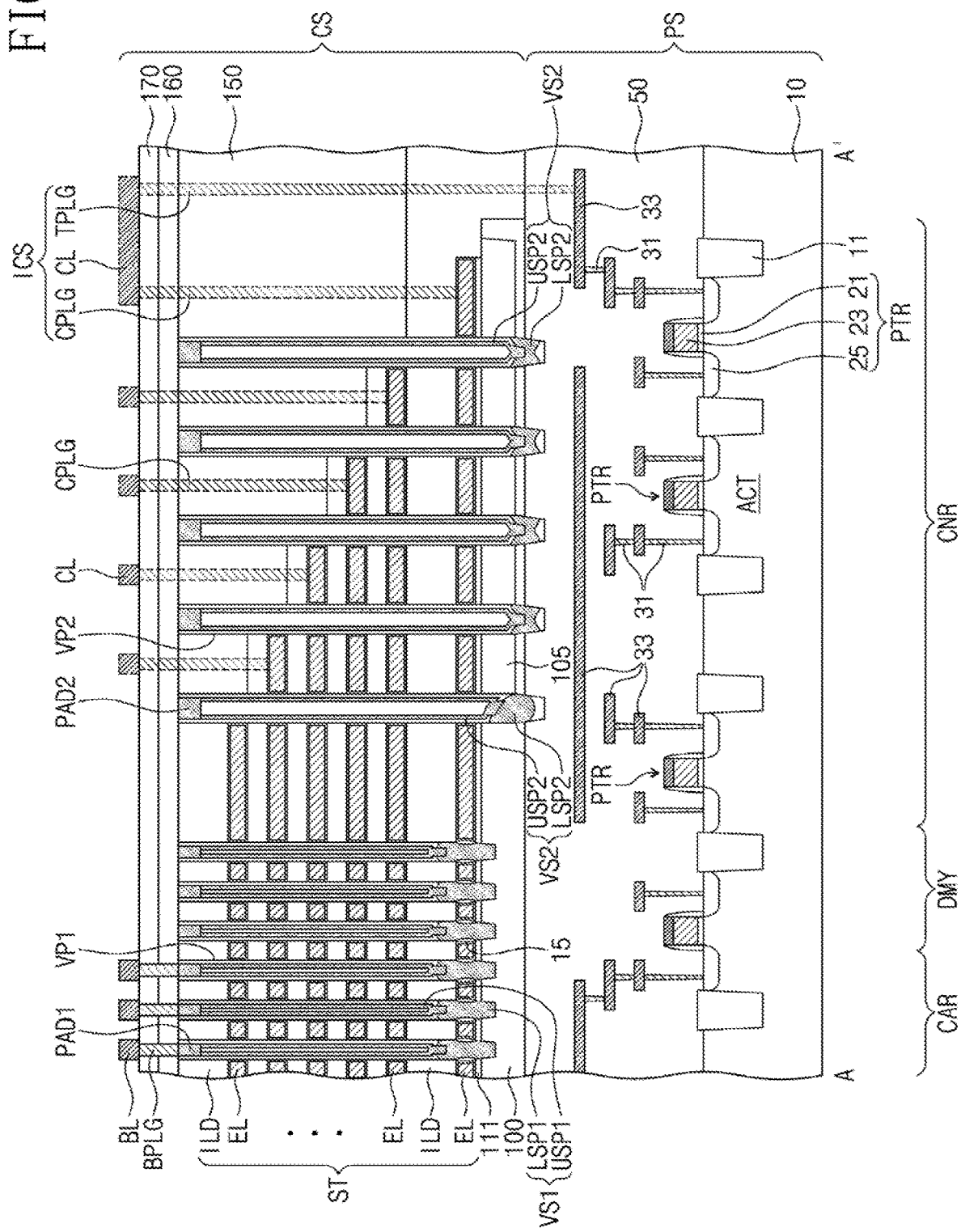

Referring to FIG. 7, a length of the dummy insulating pattern 105 in the first direction D1 may be shorter than a length of the dummy insulating pattern 105 described with reference to FIG. 4A. In addition, at least one of the second vertical structures VS2 may be provided to penetrate a sidewall of the dummy insulating pattern 105. At least one of the second lower semiconductor patterns LSP2 may have an inclined top surface that is at an angle relative to the top surface of the horizontal semiconductor layer 100. At least one of the second lower semiconductor patterns LSP2 may include two opposite side surfaces, one of which is in direct contact with the horizontal semiconductor layer 100 and the other of which is adjacent to the dummy insulating pattern 105.

Figure 8:
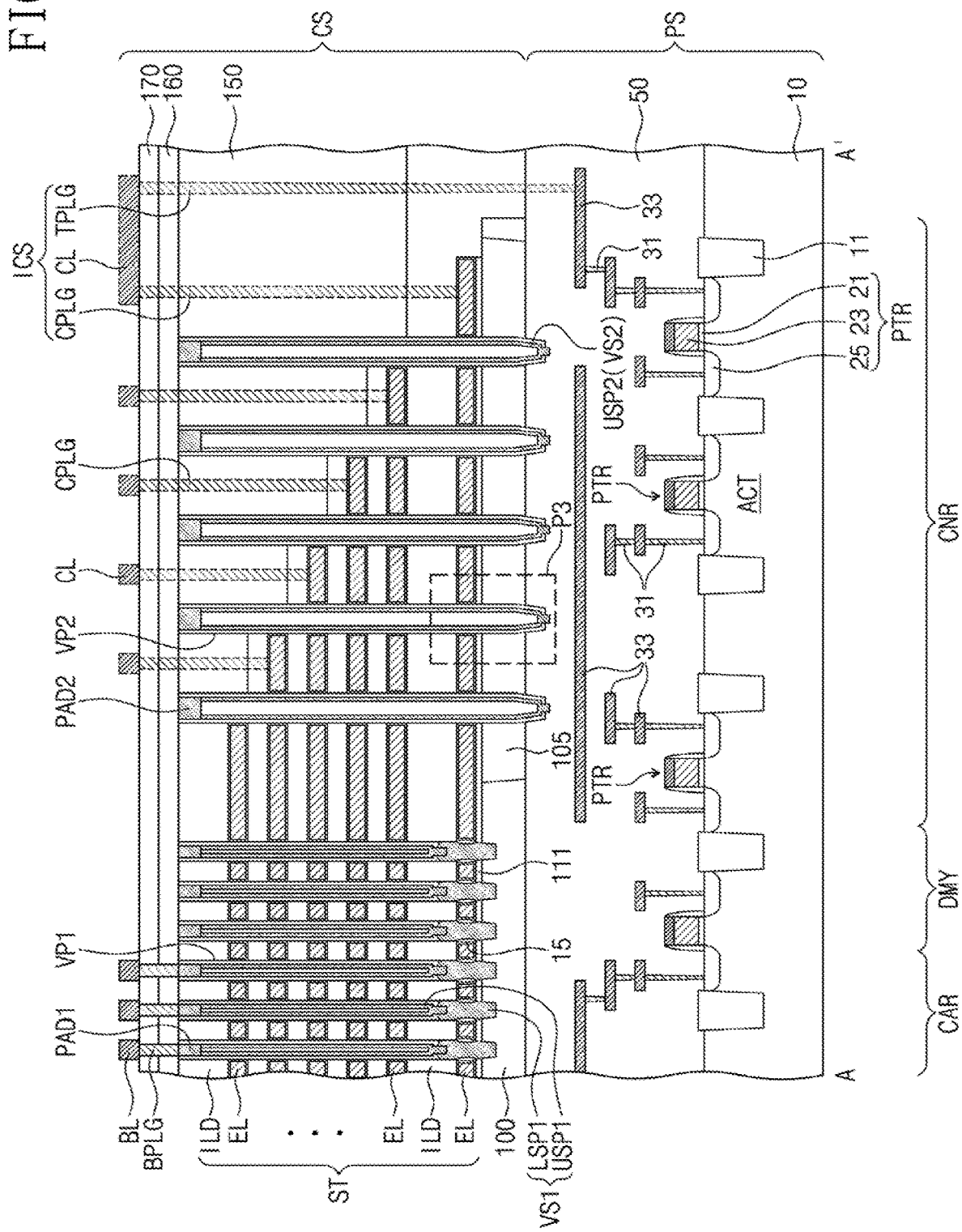
Figure 9:
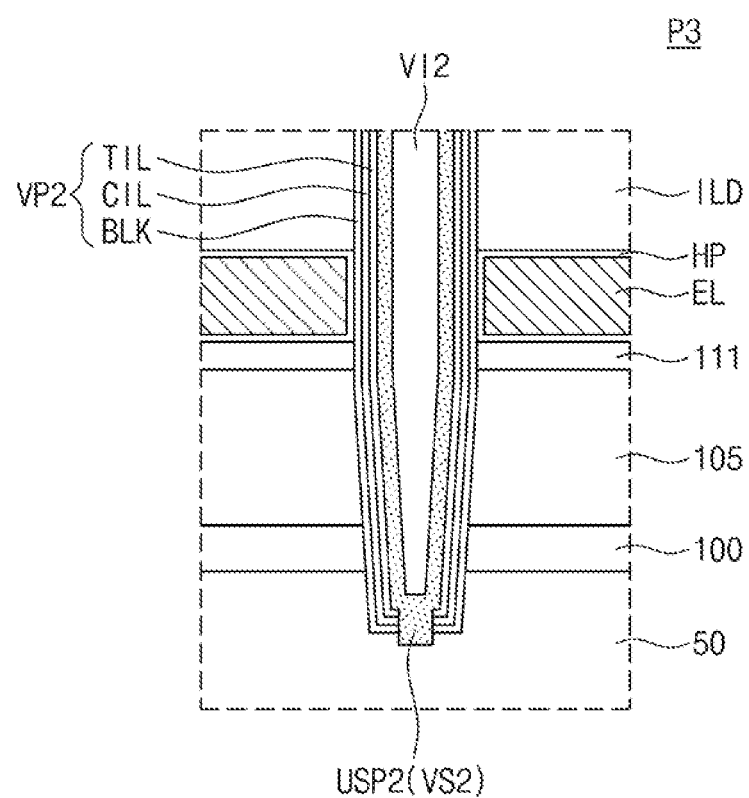
FIG. 9 is an enlarged cross-sectional view of a portion 'P3' of FIG. 8.

Referring to FIGS. 8 and 9, when measured in the third direction D3, a thickness of the dummy insulating pattern 105 may be substantially equal to a thickness of the horizontal semiconductor layer 100. As an example, the dummy insulating pattern 105 may be provided to penetrate the horizontal semiconductor layer 100 and to be in direct contact with the lower insulating layer 50.

In an exemplary embodiment of the present inventive concept, the second lower semiconductor patterns LSP2 may be omitted from the second vertical structures VS2. Bottom surfaces of the second upper semiconductor patterns USP2 and the second vertical insulating patterns VP2 may be positioned at a level lower than the bottom surface of the horizontal semiconductor layer 100. In addition, the second upper semiconductor patterns USP2 may be in direct contact with the lower insulating layer 50. In an exemplary embodiment of the present inventive concept, the second vertical insulating pattern VP2 may be extended into regions between the bottom surfaces of the second upper semiconductor patterns USP2 and the lower insulating layer 50.

Figure 10:
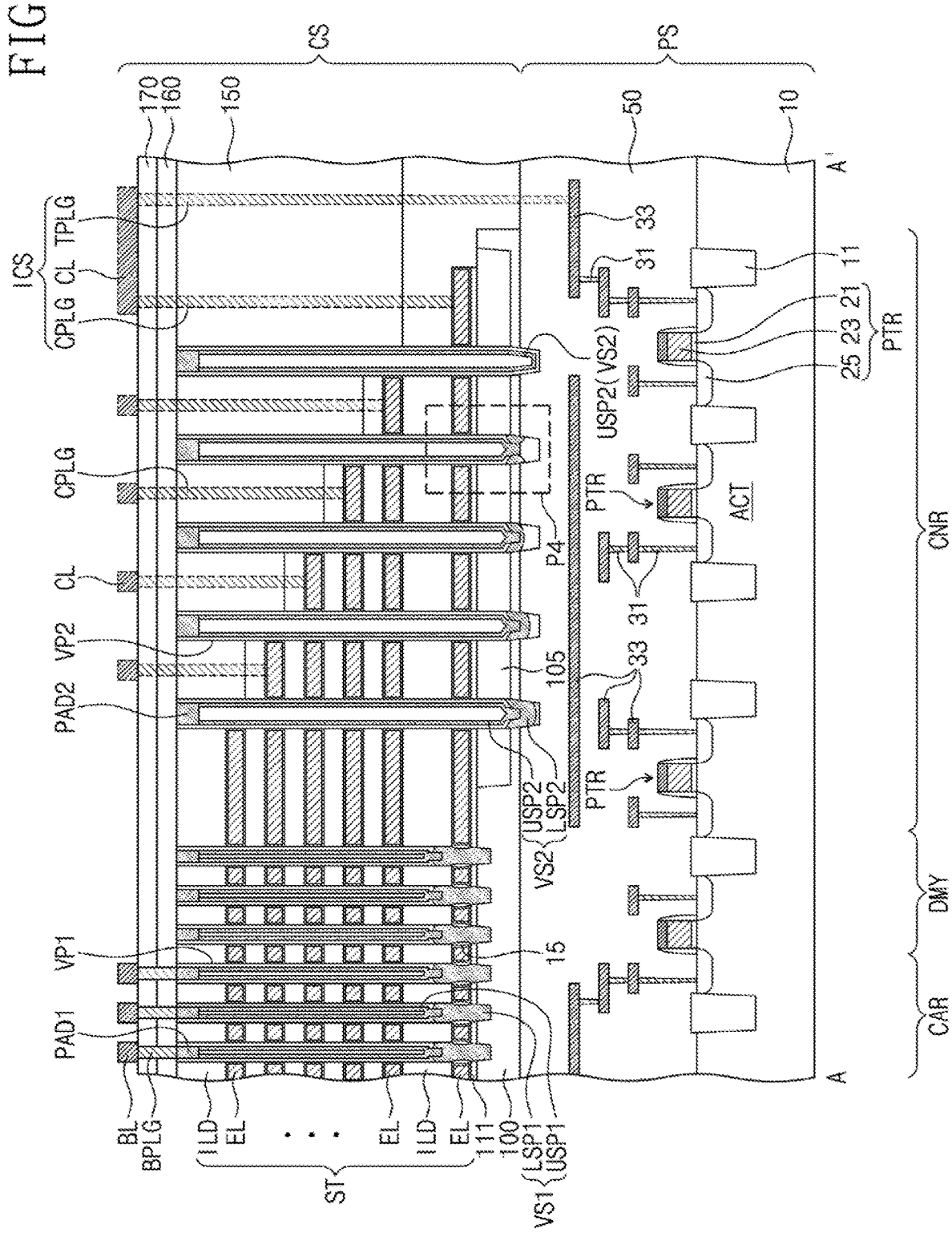
Figure 11:
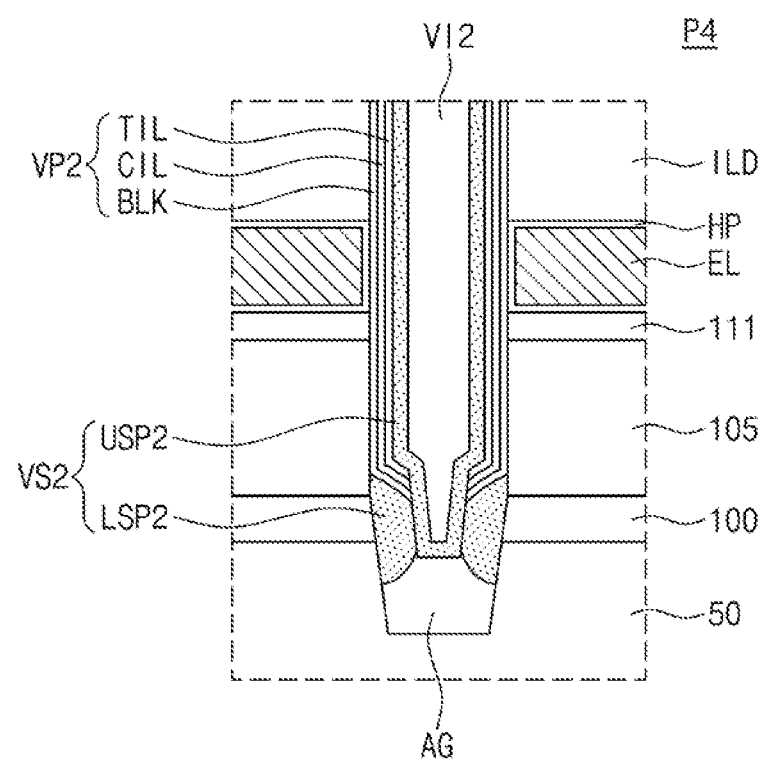
FIG. 11 is an enlarged cross-sectional view of a portion 'P4' of FIG. 10.

Referring to FIGS. 10 and 11, heights of the second lower semiconductor patterns LSP2 of the second vertical structures VS2 may decrease with increasing distance from the cell array region CAR (e.g., along the first direction D1). A second lower semiconductor pattern of the second lower semiconductor patterns LSP2 may be in direct contact with a side surface of the second upper semiconductor pattern USP2 (see, e.g., FIG. 11). Thus, the air gap AG may be defined between a bottom surface of the second upper semiconductor pattern USP2 and the lower insulating layer 50. In at least one of the second vertical structures VS2, the second lower semiconductor pattern may be omitted, and a bottom surface of the second upper semiconductor pattern USP2 may be positioned at a level lower than the bottom surface of the dummy insulating pattern 105.

Figure 12:
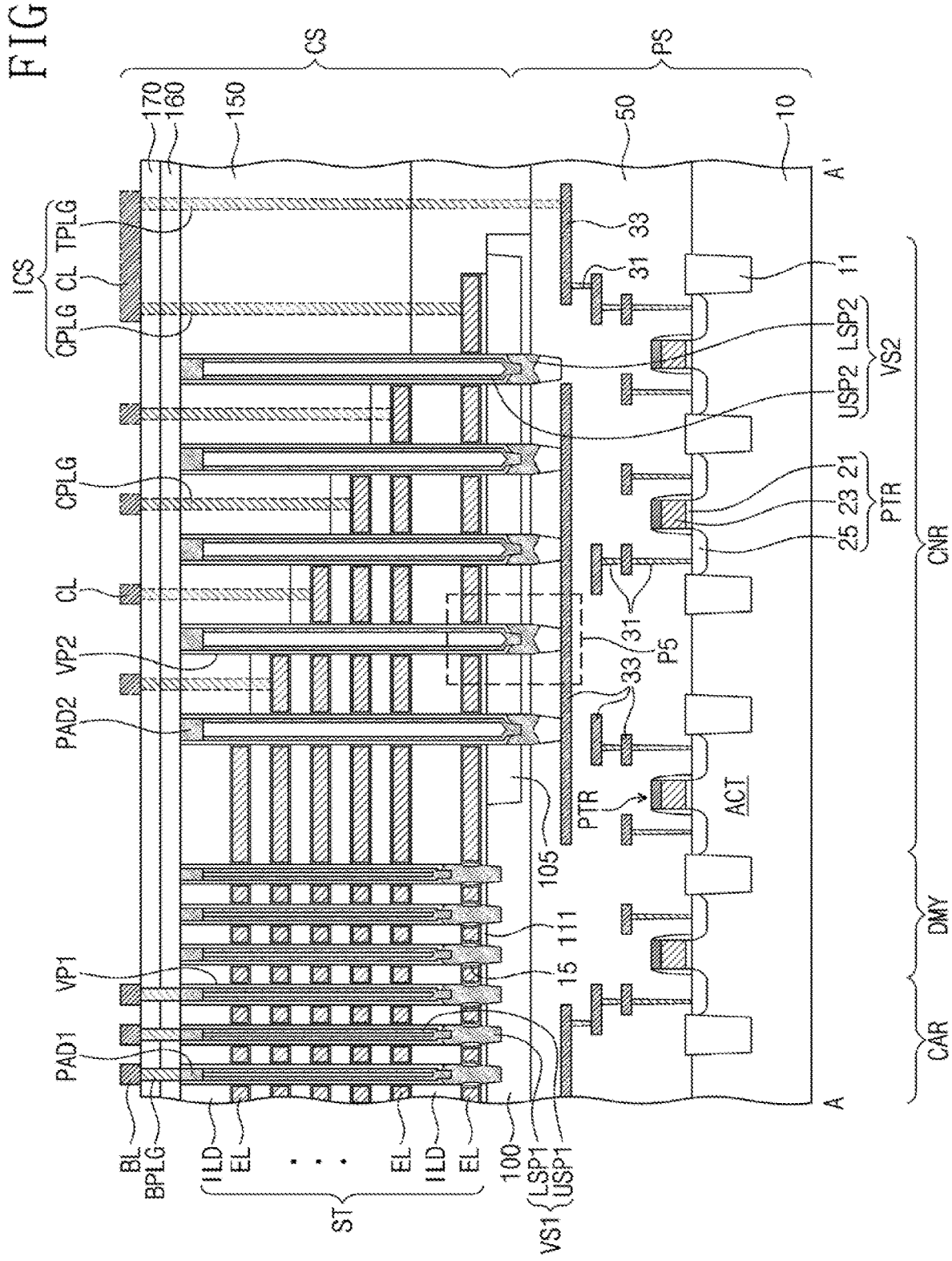

Referring to FIGS. 12 and 13, in the second vertical structures VS2, the air gap AG may be defined between the second lower semiconductor patterns LSP2 and the peripheral circuit line 33. For example, the peripheral circuit line 33 may be partially exposed to the air gap AG.

Referring to FIGS. 14 and 15, a distance in the second direction D2 between the second vertical structures VS2 may be larger than the width of the dummy insulating pattern 105. Thus, the second vertical structures VS2 may penetrate side walls of the dummy insulating pattern 105. Thus, the second lower semiconductor patterns LSP2 may have an inclined top surface.

Figure 16A:
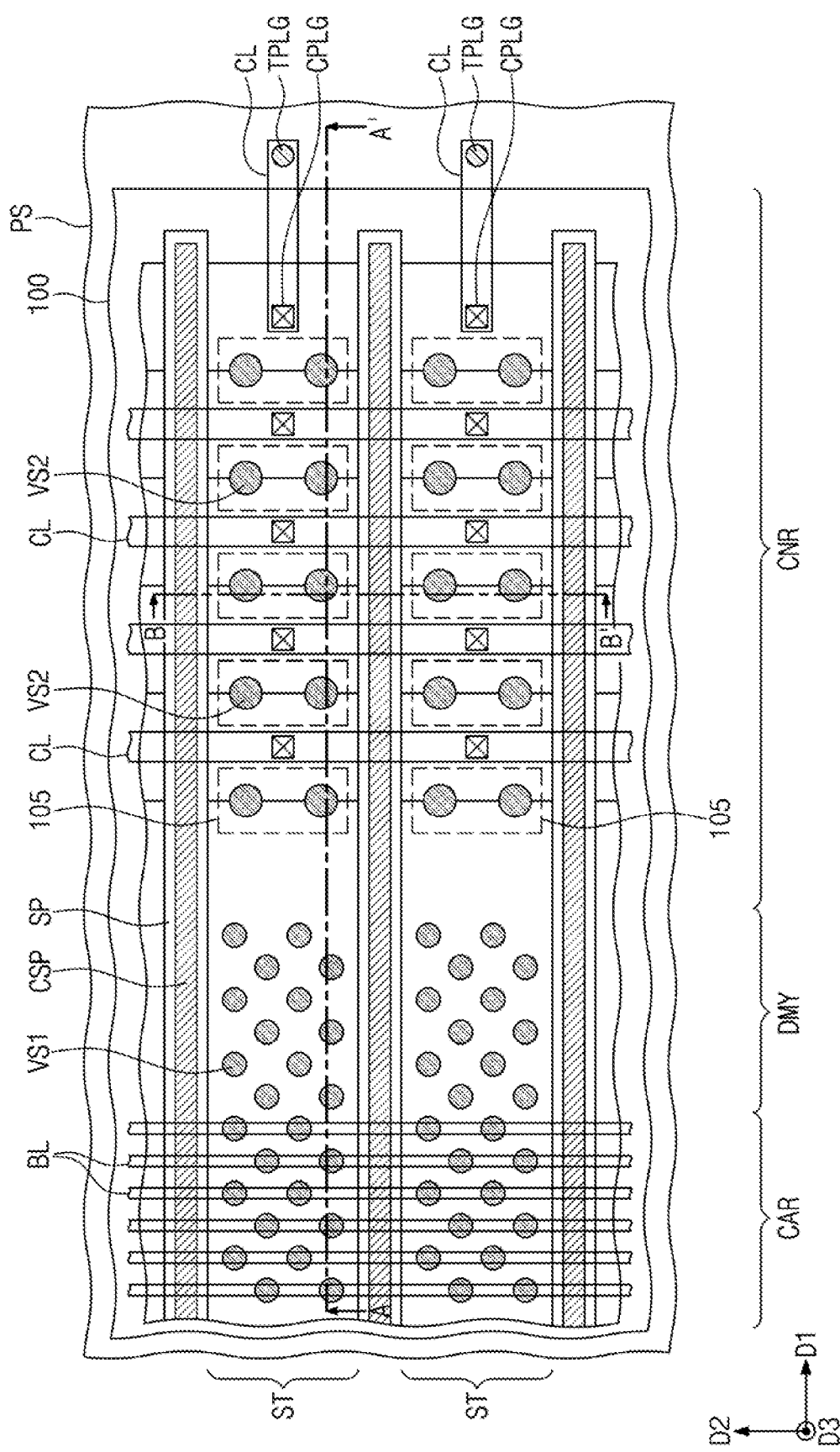
FIGS. 16A and 16B are plan views of a three-dimensional semiconductor memory device according to an exemplary embodiment of the present inventive concept.
Figure 16B:
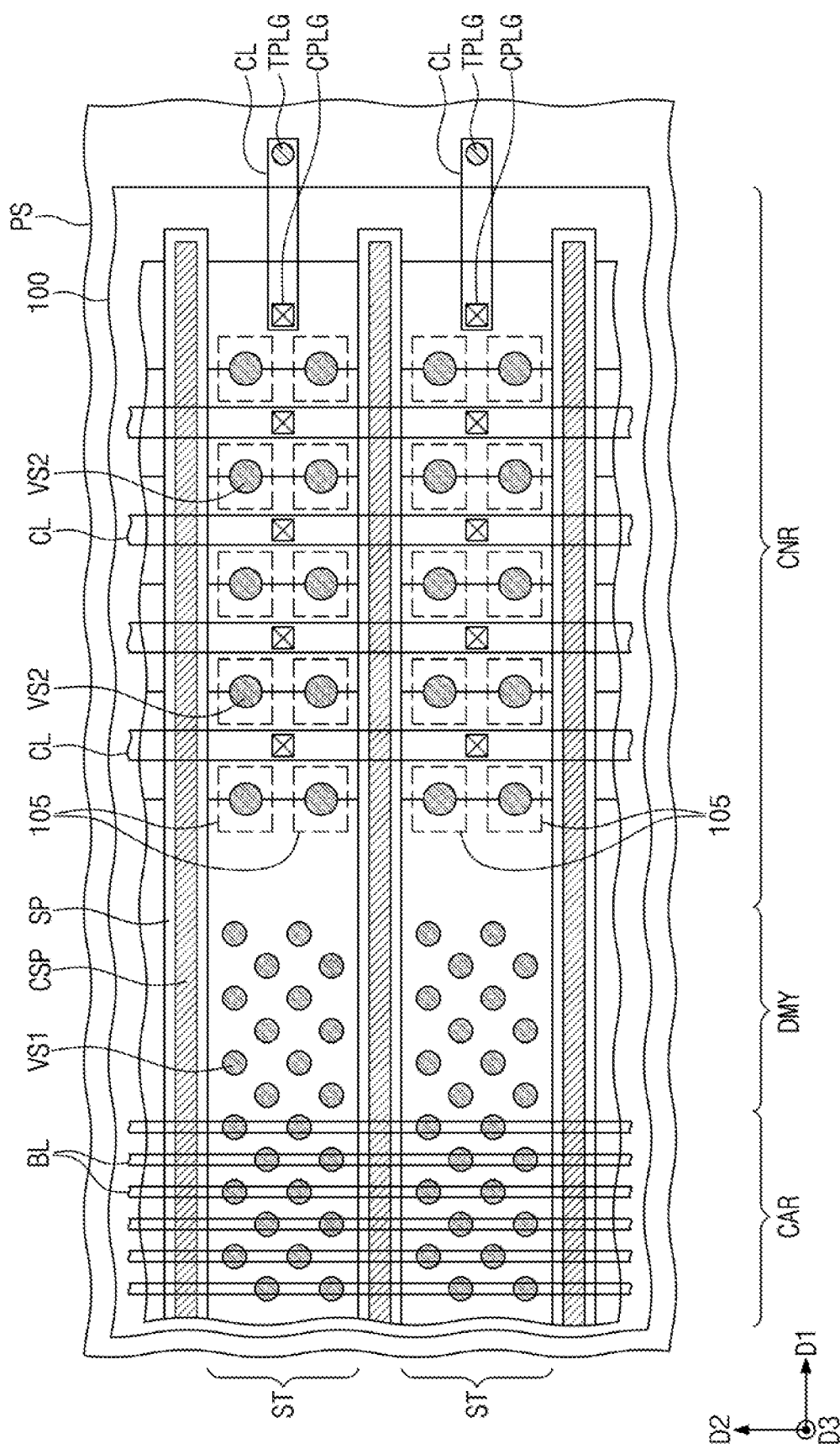
Figure 17A:
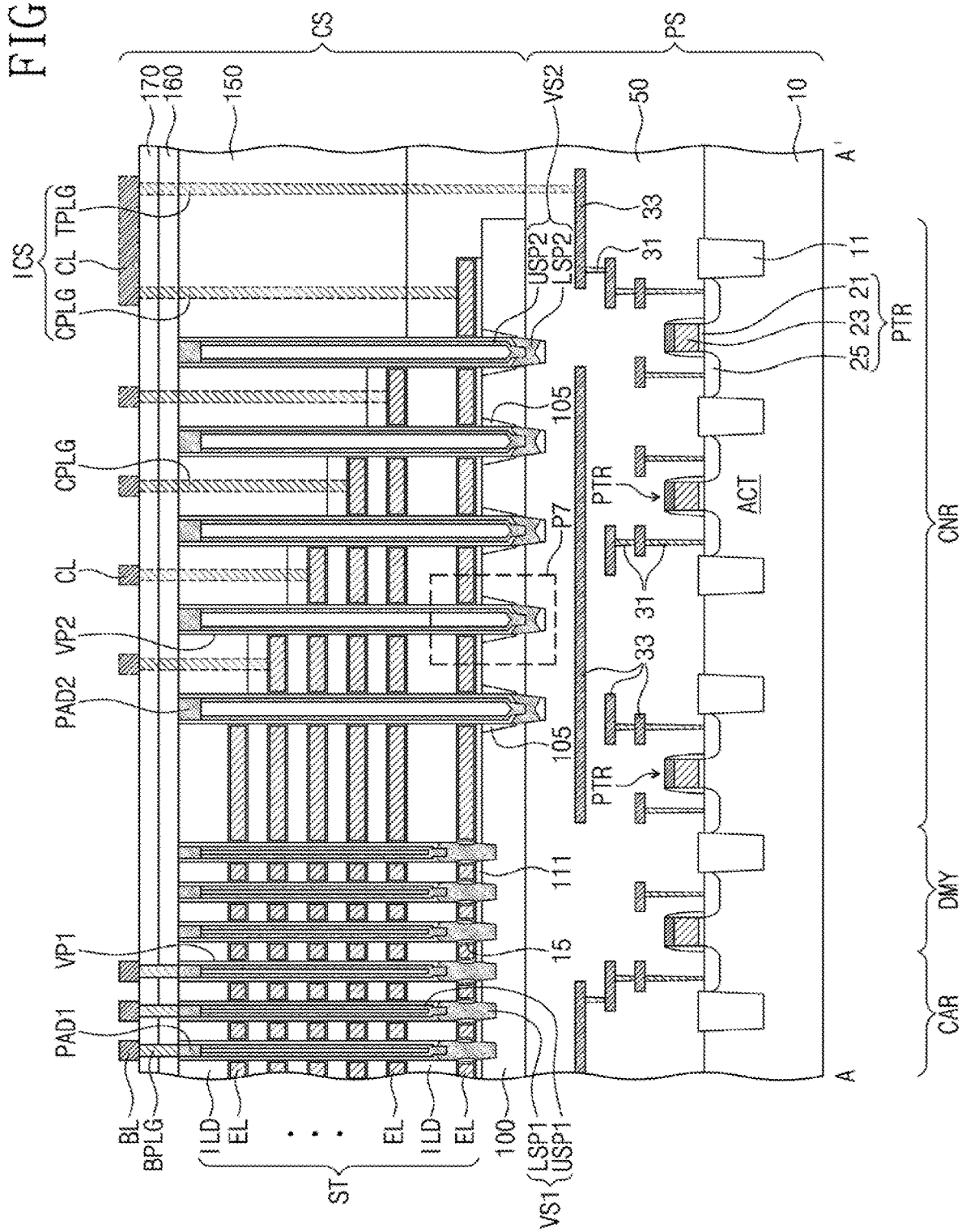
FIGS. 17A and 17B are cross-sectional views taken along lines A-A' and B-B$^1$ of FIG. 16A.
Figure 17B:
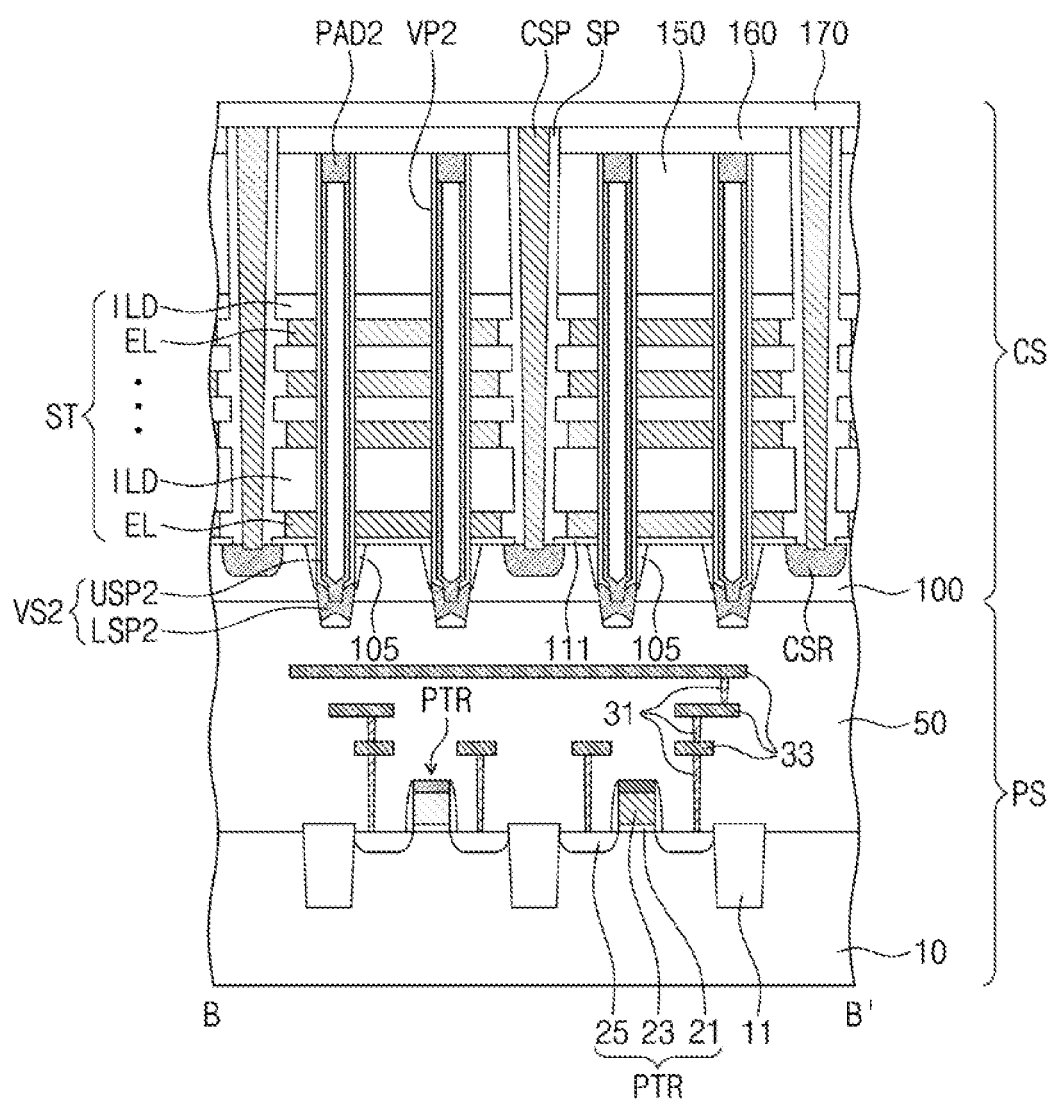
Figure 18:
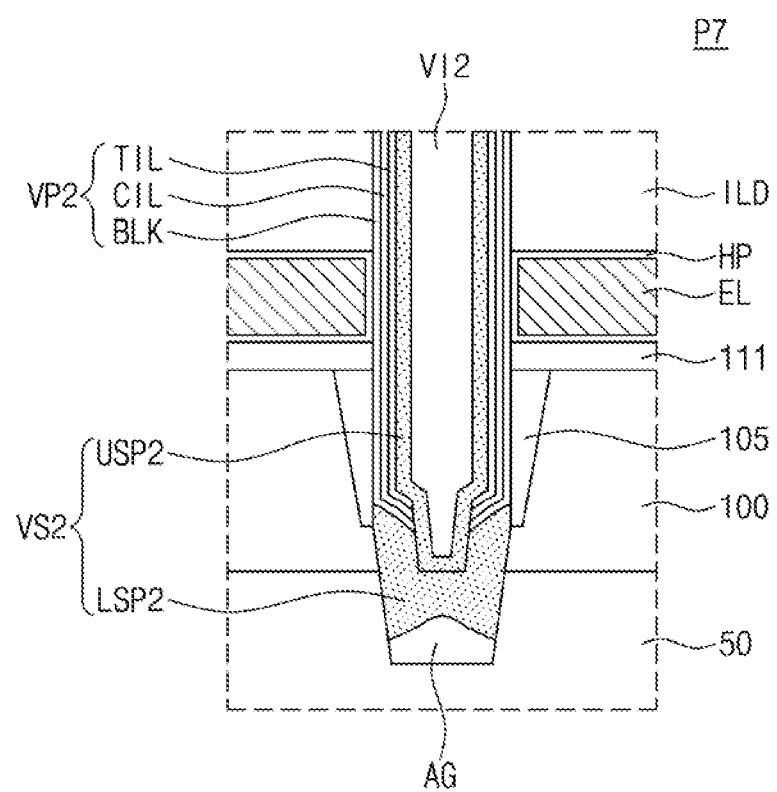
FIG. 18 is an enlarged cross-sectional view of a portion 'P7' of FIG. 17A.
Figure 19:
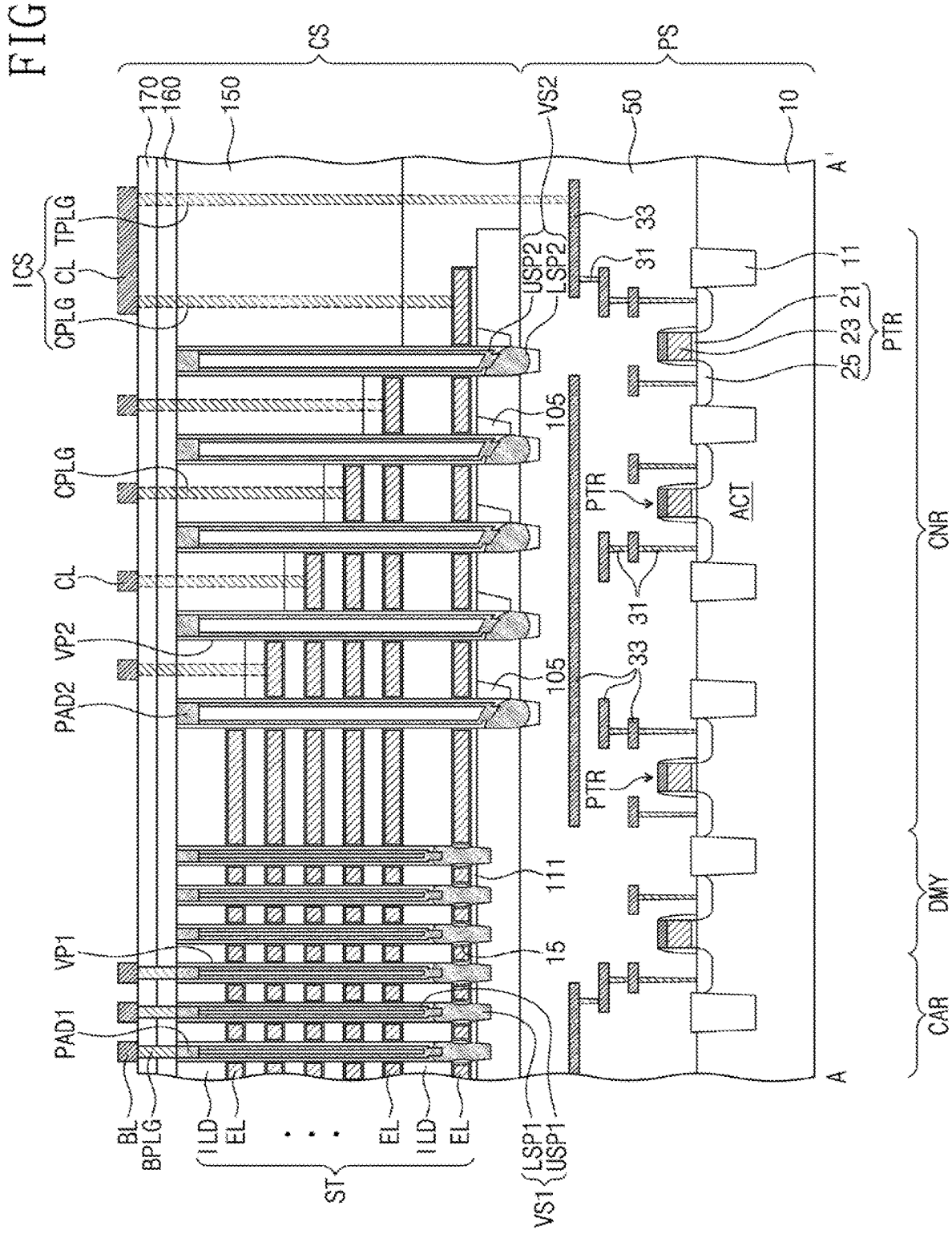
FIG. 19 is a cross-sectional view, which is taken along line A-A' of FIG. 16A, of a three-dimensional semiconductor memory device according to an exemplary embodiment of the present inventive concept.

FIGS. 16A and 16B are plan views of a three-dimensional semiconductor memory device according to an exemplary embodiment of the present inventive concept. FIGS. 17A and 17B are cross-sectional views taken along lines A-A' and B-B' of FIG. 16A. FIG. 18 is an enlarged cross-sectional view of a portion 'P7' of FIG. 17A. FIG. 19 is a cross-sectional view, which is taken along line A-A' of FIG. 16A, of a three-dimensional semiconductor memory device according to an exemplary embodiment of the present inventive concept.

Descriptions of components, layers or regions which are the same or substantially the same as those described above may be omitted below.

Referring to FIGS. 16A, 17A, and 17B, the dummy insulating patterns 105 may be spaced apart from each other in the first and second directions D1 and D2. For example, each of the electrode structures ST may be overlapped with a plurality of the dummy insulating patterns 105, when viewed in a plan view (e.g., along the third direction D3). In an exemplary embodiment of the present inventive concept, a pair of the second vertical structures VS2, which are adjacent to each other in the second direction D2, may be provided to penetrate one of the dummy insulating patterns 105. In an exemplary embodiment of the present inventive concept, each of the second vertical structures VS2 may be provided to penetrate a corresponding one of the dummy insulating patterns 105.

Referring to FIGS. 17A, 17B, and 18, widths of the dummy insulating patterns 105 in the first or second direction D1 or D2 may be smaller than a width of the electrode structure ST in the second direction D2. Lower widths of the second vertical structures VS2 may be smaller than lower widths of the dummy insulating patterns 105. The second vertical insulating patterns VP2 may be provided between the dummy insulating pattern 105 and the second upper semiconductor patterns USP2, respectively. The second lower semiconductor patterns LSP2 may be connected to portions of the horizontal semiconductor layer 100, which are located between the dummy insulating patterns 105 and the lower insulating layer 50.

Referring to FIG. 19, a plurality of the dummy insulating patterns 105 may be provided in the connection region CNR of the horizontal semiconductor layer 100, and the second vertical structures VS2 may be provided to at least partially penetrate the dummy insulating patterns 105, respectively. The second vertical structures VS2 may be provided to penetrate side walls of the dummy insulating patterns 105. Thus, each of the second lower semiconductor patterns LSP2 may be provided in such a way that a portion in direct contact with the horizontal semiconductor layer 100 has a height different from that of another portion in direct contact with the dummy insulating pattern 105.

FIGS. 20A, 21A, 22A, 23A, 24A, 25A, 26A, 20B, 21B, 22B, 23B, 24B, 25B and 26B are cross-sectional views of a method of fabricating a three-dimensional semiconductor memory device, according to an exemplary embodiment of the present inventive concept. FIGS. 20A to 26A are cross-sectional views taken along line A-A' of FIG. 3A, and FIGS. 20B to 26B are cross-sectional views taken along line B-B' of FIG. 3B.

Figure 20A:
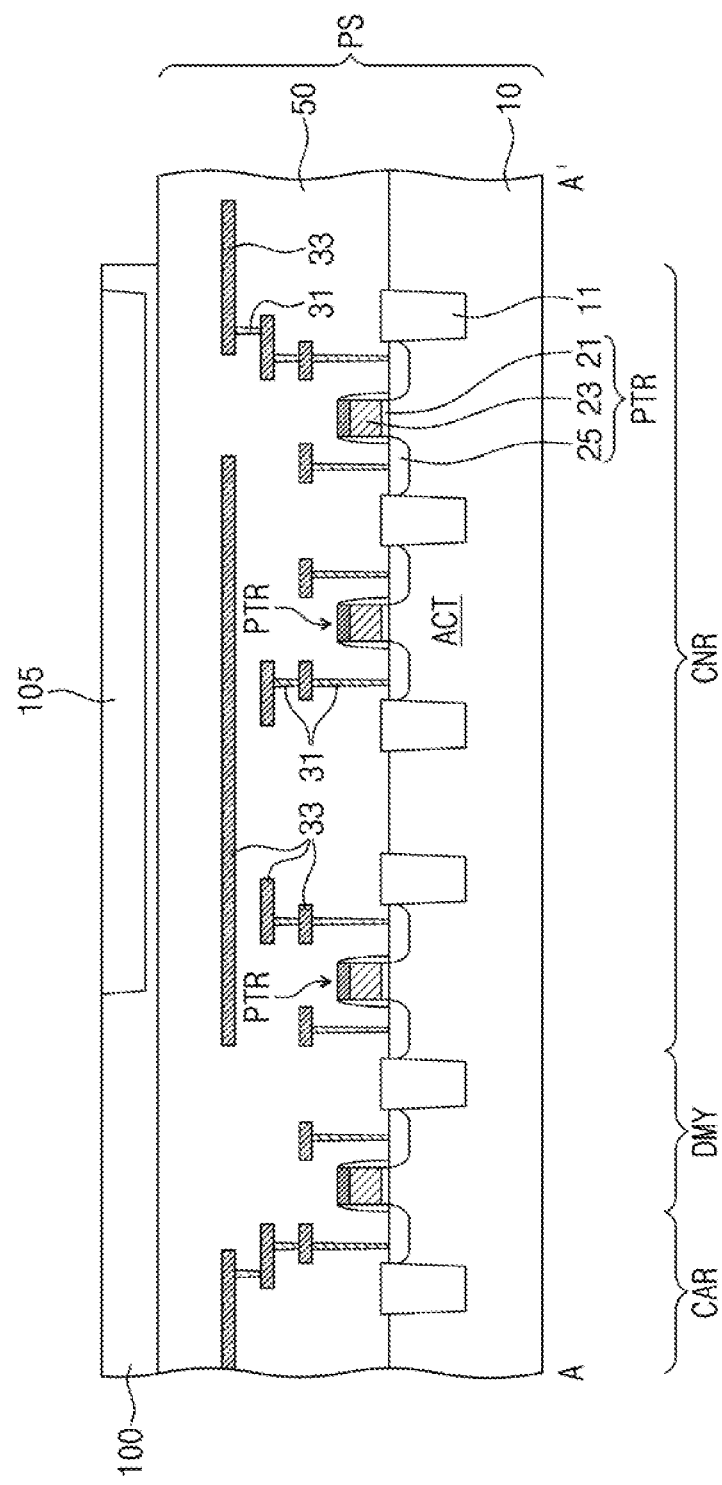
Figure 20B:
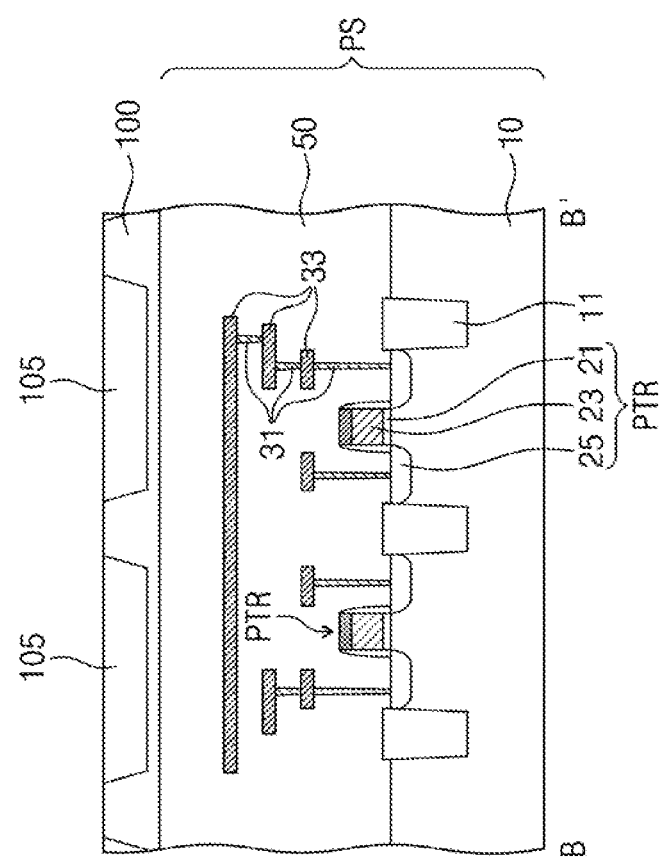

Referring to FIGS. 3A, 20A, and 20B, the peripheral logic structure PS may be formed on the semiconductor substrate 10. The semiconductor substrate 10 may be a silicon substrate that is doped to have a first conductivity type (e.g., p-type). The device isolation layer 11 may be formed in the semiconductor substrate 10 to define the active regions ACT.

The formation of the peripheral logic structure PS may include forming the peripheral logic circuits PTR on the semiconductor substrate 10, forming peripheral interconnection structures 31 and 33 connected to the peripheral logic circuits PTR, and forming the lower insulating layer 50. The peripheral logic circuits PTR may include MOS transistors, in which the semiconductor substrate 10 is used as channel regions thereof. As an example, the formation of the peripheral logic circuits PTR may include forming the device isolation layer 11 in the semiconductor substrate 10 to define the active regions ACT, sequentially forming the peripheral gate insulating layer 21 and the peripheral gate electrode 23 on the semiconductor substrate 10, and injecting impurities into portions of the semiconductor substrate 10, which are located at opposite sides of the peripheral gate electrode 23, to form the source/drain regions 25. Peripheral gate spacers may be formed on side surfaces of the peripheral gate electrode 23.

The lower insulating layer 50 may include one or more insulating layers covering the peripheral logic circuits PTR. The lower insulating layer 50 may be formed of or include at least one of, for example, silicon oxide, silicon nitride, silicon oxynitride, or low-k dielectric materials.

The formation of the peripheral interconnection structures 31 and 33 may include forming the peripheral contact plugs 31 to penetrate portions of the lower insulating layer 50 and forming the peripheral circuit lines 33 connected to the peripheral contact plugs 31.

A semiconductor material may be deposited on the lower insulating layer 50 to form the horizontal semiconductor layer 100. The horizontal semiconductor layer 100 may have a single- or poly-crystal structure. As an example, the horizontal semiconductor layer 100 may be formed by depositing a poly-silicon layer to cover the top surface of the lower insulating layer 50. The poly-silicon layer may be doped with impurities of the first conductivity type, during its deposition process. The horizontal semiconductor layer 100 may be patterned to expose a portion of the lower insulating layer 50. The horizontal semiconductor layer 100 may include the cell array region CAR, the dummy cell region DMY, and the connection region CNR.

A plurality of the dummy insulating patterns 105 may be formed in the connection region CNR of the horizontal semiconductor layer 100. The formation of the dummy insulating patterns 105 may include forming trenches in the connection region CNR of the horizontal semiconductor layer 100 and substantially filling the trenches with an insulating material. The dummy insulating patterns 105 may be formed to have a line-, bar- or island-shaped structure (see, e.g., FIGS. 3A, 3B, 19A, and 16B). Thicknesses of the dummy insulating patterns 105 in the third direction D3 may be smaller than a thickness of the horizontal semiconductor layer 100. Thus, the bottom surfaces of the dummy insulating patterns 105 may be spaced apart from the bottom surface of the horizontal semiconductor layer 100. In an exemplary embodiment of the present inventive concept, when measured in the third direction D3, the thicknesses of the dummy insulating patterns 105 may be substantially equal to the thickness of the horizontal semiconductor layer 100. In an exemplary embodiment of the present inventive concept, at least one of the dummy insulating patterns 105 may also be formed in the connection region CNR and the dummy cell region DMY of the horizontal semiconductor layer 100.

Figure 21A:
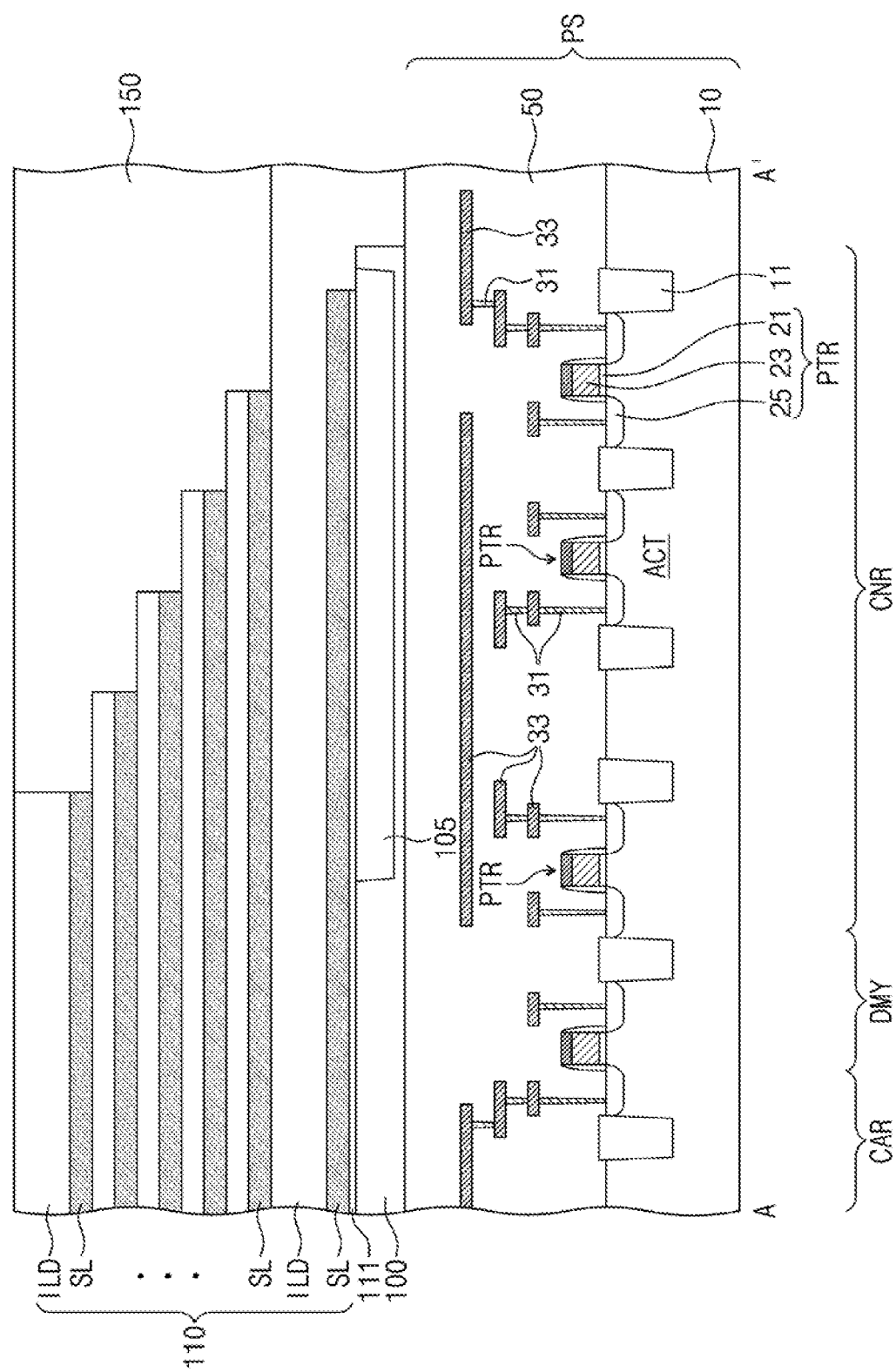
Figure 21B:
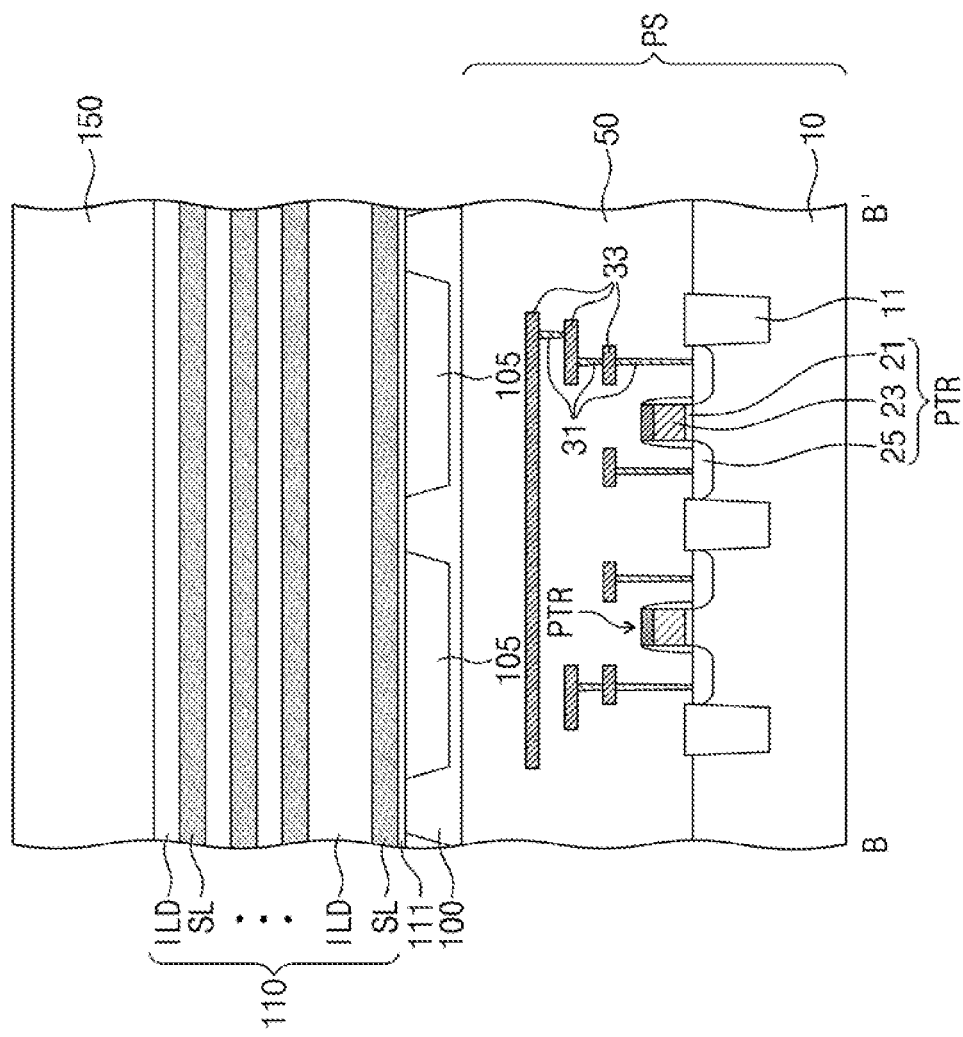

Referring to FIGS. 3A, 21A, and 21B, the buffer insulating layer 111 may be formed by thermally oxidizing the top surface of the horizontal semiconductor layer 100. A mold structure 110, in which sacrificial and insulating layers SL and ILD may be alternately and repeatedly stacked, may be formed on the buffer insulating layer 111. In the mold structure 110, the sacrificial layers SL may include at least one of materials, which can be etched with a high etch selectivity with respect to the insulating layers ILD. For example, the sacrificial layers SL may include an insulating material different from the insulating layers ILD. As an example, the sacrificial layers SL may include silicon nitride, and the insulating layers ILD may include silicon oxide. The sacrificial layers SL may be formed to have substantially the same thickness as each other, and the insulating layers ILD may be formed to have at least two different thicknesses. For example, the lowermost one of the insulating layers ILD may be thicker than the others and may be formed to cover the lowermost sacrificial layer SL and a portion of the horizontal semiconductor layer 100.

In an exemplary embodiment of the present inventive concept, the formation of the mold structure 110 may include forming a layered structure, in which the sacrificial layers SL and the insulating layers ILD are alternately and repeatedly stacked, on the horizontal semiconductor layer 100, and performing a trimming process on the layered structure. The trimming process may include steps of forming a mask pattern to cover the layered structure on the cell array region CAR, the dummy cell region DMY, and the connection region CNR, etching the layered structure on the connection region CNR using the mask pattern as an etch mask, etching the mask pattern to reduce a planar area of the mask pattern, and removing the mask pattern. The steps of etching the layered structure and the mask pattern may be repeated several times, before the step of removing the mask pattern. After the trimming process, the mold structure 110 may be formed to have a staircase structure on the connection region CNR.

After the formation of the mold structure 110, the planarized insulating layer 150 may be formed on the top surface of the horizontal semiconductor layer 100. The planarized insulating layer 150 may be formed to have a substantially flat top surface and may be formed to include an insulating material having an etch selectivity with respect to the sacrificial layers SL.

Figure 22A:
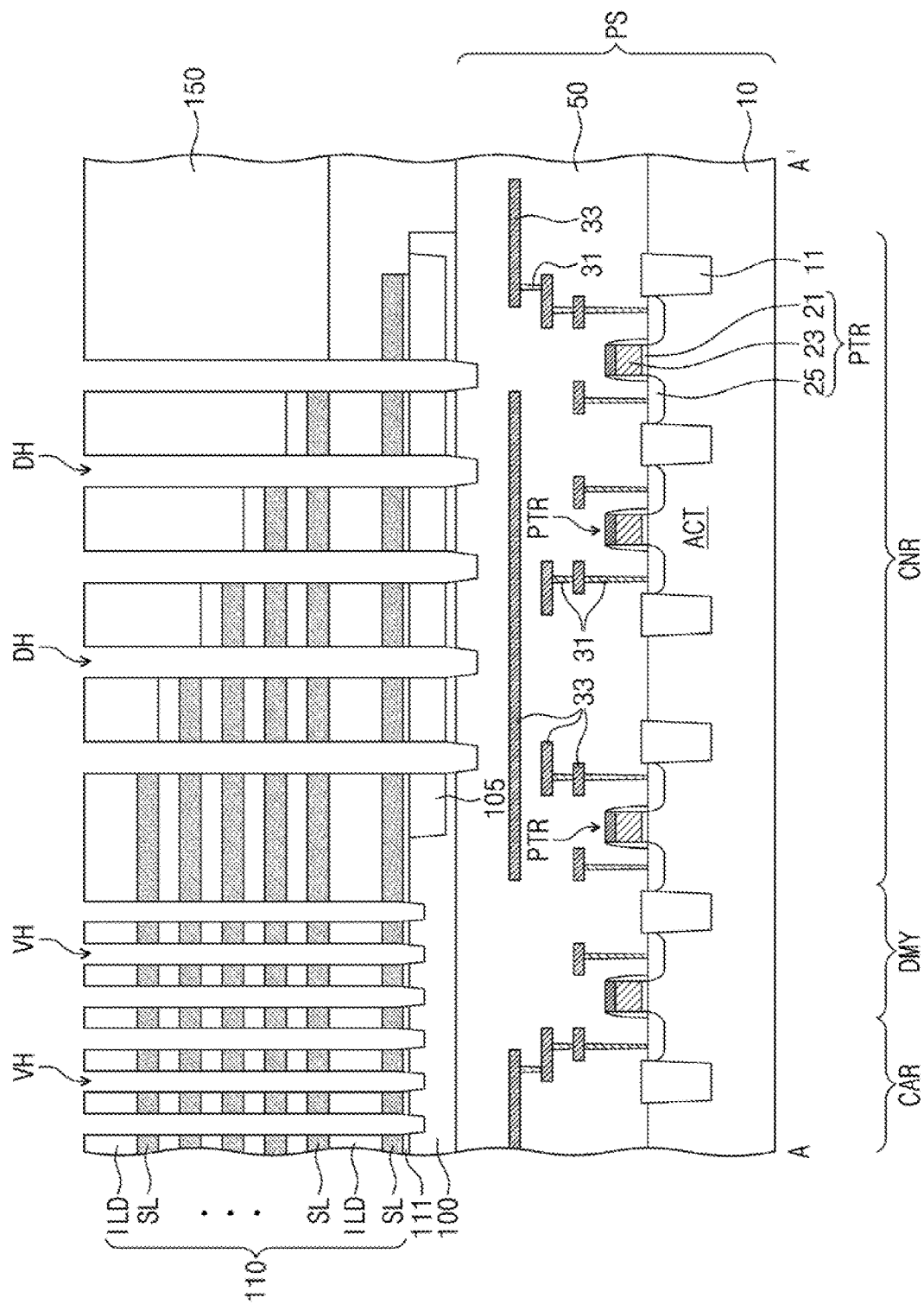
Figure 22B:
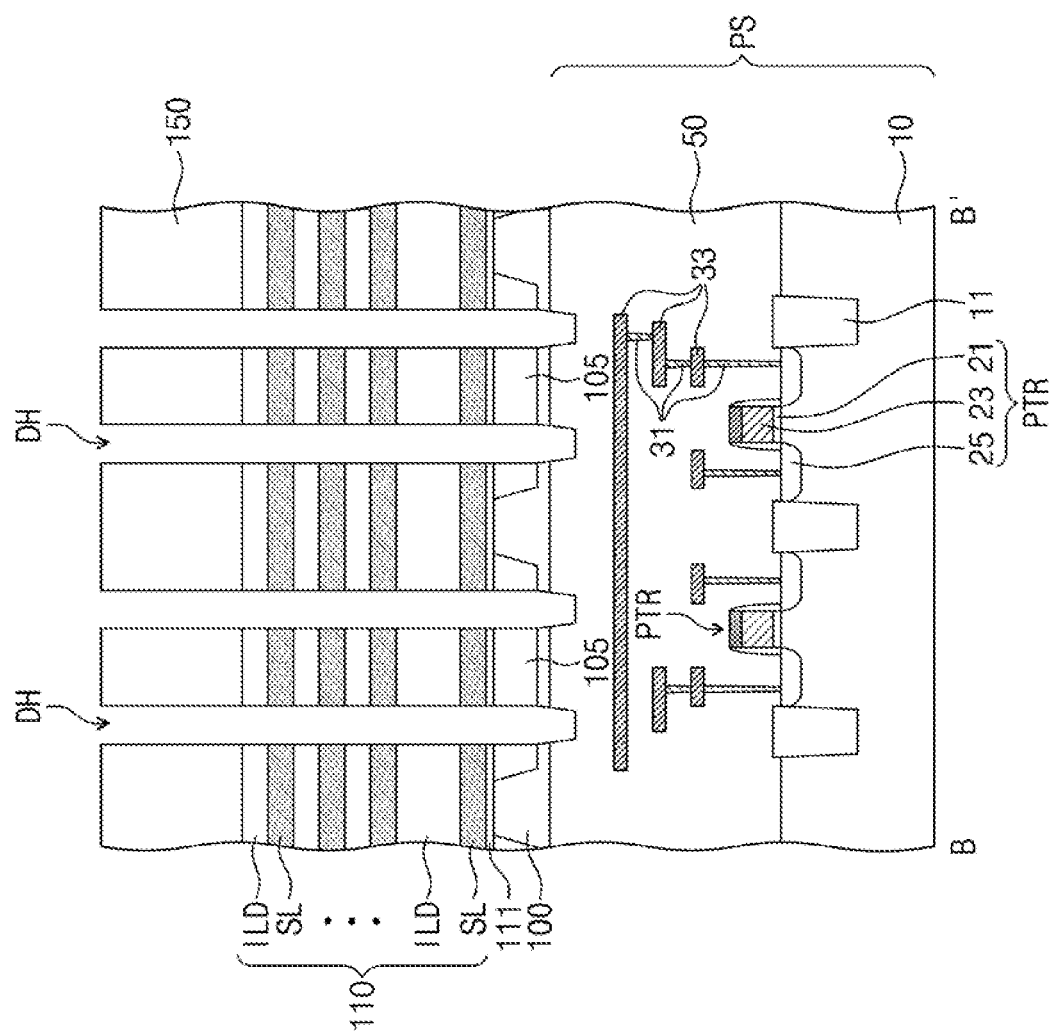

Referring to FIGS. 3A, 22A, and 22B, first vertical holes VH may be formed on the cell array region CAR and the dummy cell region DMY to penetrate the mold structure 110, and second vertical holes DH may be formed on the connection region CNR to penetrate the planarized insulating layer 150, the mold structure 110, and the dummy insulating patterns 105.

The formation of the first and second vertical holes VH and DH may include forming a mask pattern on the mold structure 110 and the planarized insulating layer 150 and anisotropically etching the mold structure 110 and the planarized insulating layer 150 using the mask pattern as an etch mask.

The first vertical holes VH may be arranged in a predetermined direction or in a zigzag shape, when viewed in a plan view. The second vertical holes DH may be arranged in a predetermined direction, when viewed in a plan view, and may be formed to penetrate end portions of the sacrificial layers SL on the connection region CNR. Since the second vertical holes DH are formed on the connection region CNR, the number of the sacrificial layers SL, which are intersected with the second vertical holes DH, may decrease with increasing distance from the cell array region CAR. The first and second vertical holes VH and DH may be formed to have lower widths that are smaller than upper widths thereof.

During the anisotropic etching process for forming the first vertical holes VH, the top surface of the horizontal semiconductor layer 100 may be over-etched, and in this case, top surfaces of portions of the horizontal semiconductor layer 100 exposed by the first vertical holes VH may be recessed to a specific depth.

In an exemplary embodiment of the present inventive concept, during the anisotropic etching process for forming the first and second vertical holes VH and DH, the horizontal semiconductor layer 100 may be etched at an etch rate different from that of the dummy insulating patterns 105, and thus, the bottom surfaces of the second vertical holes DH may be positioned at a level lower than the bottom surfaces of the first vertical holes VH. For example, in the case where the horizontal semiconductor layer 100 is formed to include silicon, the dummy insulating patterns 105 may be etched at a relatively high etch rate during the etching of the horizontal semiconductor layer 100. When the horizontal semiconductor layer 100 is over-etched through the first vertical holes VH, the second vertical holes DH may be formed to penetrate not only the dummy insulating patterns 105 but also portions of the horizontal semiconductor layer 100 located under the dummy insulating patterns 105. As an example, when the horizontal semiconductor layer 100 is exposed through the first vertical holes VH, the second vertical holes DH may be formed to penetrate the dummy insulating patterns 105 and to expose the horizontal semiconductor layer 100 and the lower insulating layer 50, which are provided below the dummy insulating patterns 105. Thus, the bottom surfaces of the second vertical holes DH may be positioned at a level lower than the bottom surface of the horizontal semiconductor layer 100. In an exemplary embodiment of the present inventive concept, during the anisotropic etching process for forming the first and second vertical holes VH and DH, the second vertical holes DH may be formed to partially penetrate the lower insulating layer 50, thus exposing portions of the topmost ones of the peripheral circuit lines 33 (e.g., as described with reference to FIG. 12).

In an exemplary embodiment of the present inventive concept, the dummy insulating patterns 105 may extend from the connection region CNR to the dummy cell region DMY, and thus the bottom surfaces of the first vertical holes VH may be lower on the dummy cell region DMY than on the cell array region CAR. As an example, the first vertical holes VH located on the dummy cell region DMY may be formed to expose the dummy insulating patterns 105.

Figure 23A:
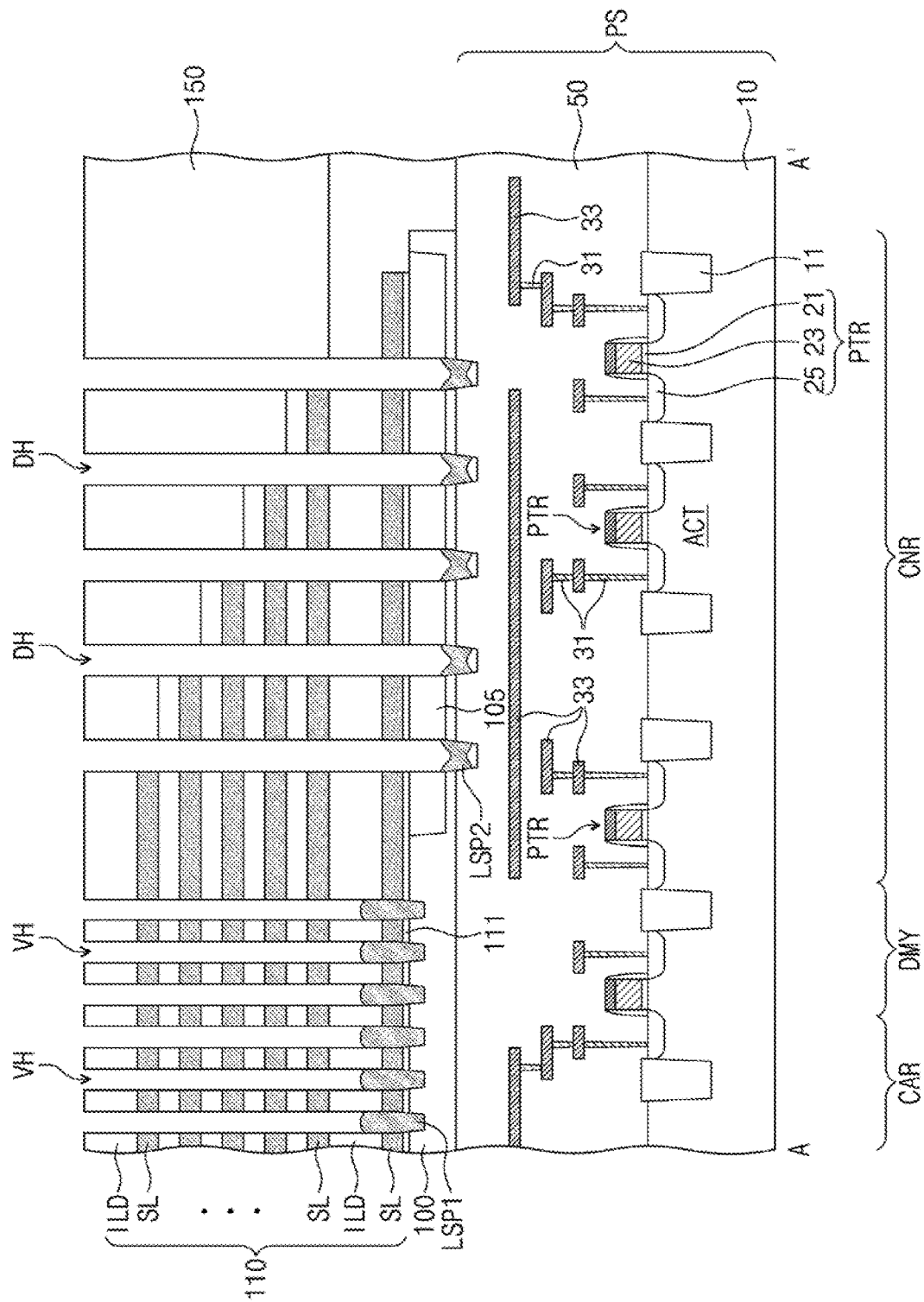
Figure 23B:
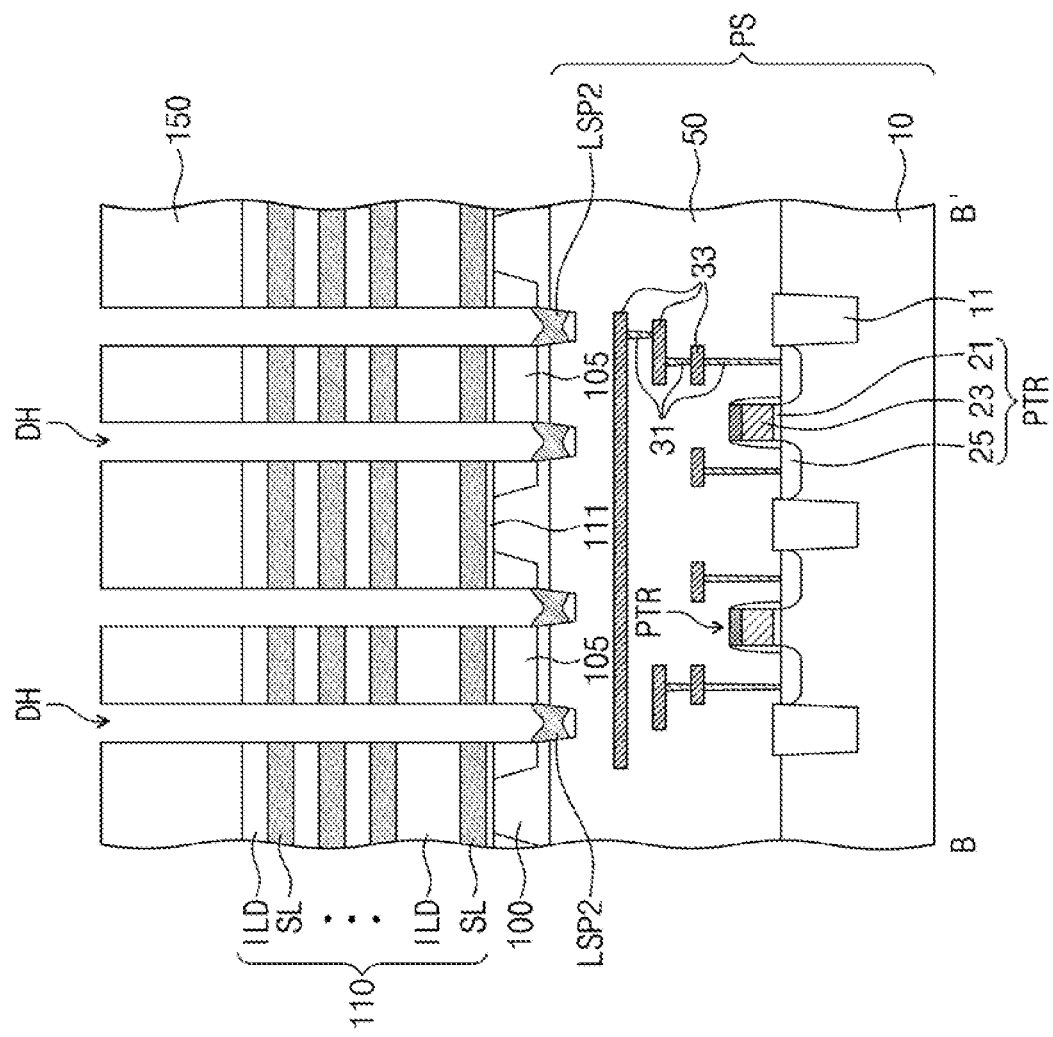

Referring to FIGS. 3A, 23A, and 23B, the first and second lower semiconductor patterns LSP1 and LSP2 may be formed in lower regions of the first and second vertical holes VH and DH, respectively.

The formation of the first and second lower semiconductor patterns LSP1 and LSP2 may include performing a selective epitaxial growth (SEG) process using portions of the horizontal semiconductor layer 100, which is exposed by the first and second vertical holes VH and DH, as a seed layer.

As a result of the SEG process, the first and second lower semiconductor patterns LSP1 and LSP2 may be formed to have a single-crystalline structure or a poly-crystalline structure having a grain size larger than a poly-crystalline layer formed by a chemical vapor deposition technology. In an exemplary embodiment of the present inventive concept, silicon may be used for the first and second lower semiconductor patterns LSP1 and LSP2, but exemplary embodiments of the present inventive concept are not limited thereto. The first and second lower semiconductor patterns LSP1 and LSP2 may be formed of or include at least one of, for example, carbon nano structures, organic semiconductor materials, or compound semiconductors. The first and second lower semiconductor patterns LSP1 and LSP2 may have the same conductivity type as that of the horizontal semiconductor layer 100. The first and second lower semiconductor patterns LSP1 and LSP2 may be doped in situ with impurities during the SEG process.

In an exemplary embodiment of the present inventive concept, the first lower semiconductor patterns LSP1 may be pillar-shaped semiconductor patterns, which are grown from portions of the horizontal semiconductor layer 100, which are exposed through the first vertical holes VH, to fill lower regions of the first vertical holes VH.

During the epitaxial growth process, a portion of the horizontal semiconductor layer 100 between the lower insulating layer 50 and the dummy insulating pattern 105 may be used as a seed layer, and thus, the second lower semiconductor patterns LSP2 may be laterally grown from side walls of the horizontal semiconductor layer 100, which are located below the dummy insulating patterns 105 and are defined by the side surfaces of the second vertical holes DH. Thus, the second lower semiconductor patterns LSP2 may have a non-flat (e.g., curved) top surface and a non-flat (e.g., curved) bottom surface, and the air gap AG defined by the second lower semiconductor patterns LSP2 may be formed in lower regions of the second vertical holes DH.

In an exemplary embodiment of the present inventive concept, during the SEG process of forming the first and second lower semiconductor patterns LSP1 and LSP2, an undesired gas (e.g., hydrogen, carbon, or nitrogen gas) may be produced from the planarized insulating layer 150 and then may be outgassed through the second vertical holes DH. The undesired gas may prevent the second lower semiconductor patterns LSP2 from being growing in the lower regions of the second vertical holes DH. Accordingly, the second lower semiconductor patterns LSP2 may have heights smaller than those of the first lower semiconductor patterns LSP1. The top surfaces of the first lower semiconductor patterns LSP1 may be positioned at a level higher than the top surface of the lowermost one of the sacrificial layers SL, and the top surfaces of the second lower semiconductor patterns LSP2 may be positioned at a level lower than the bottom surface of the lowermost one of the sacrificial layers SL (e.g., the top surface of the horizontal semiconductor layer 100). In addition, a portion of the side surface of the first lower semiconductor pattern LSP1 may be in direct contact with the lowermost one of the sacrificial layers SL, and the side surface of the second lower semiconductor pattern LSP2 may be in direct contact with a portion of the dummy insulating pattern 105.

Since a thickness of the planarized insulating layer 150 may increase with increasing distance from the cell array region CAR, an amount of the undesired gas, which is outgassed through the second vertical holes DH during the SEG process, may increase with increasing distance from the cell array region CAR. Accordingly, a height of the second lower semiconductor pattern LSP2 may decrease with increasing distance of the second vertical hole DH from the cell array region CAR.

Figure 24A:
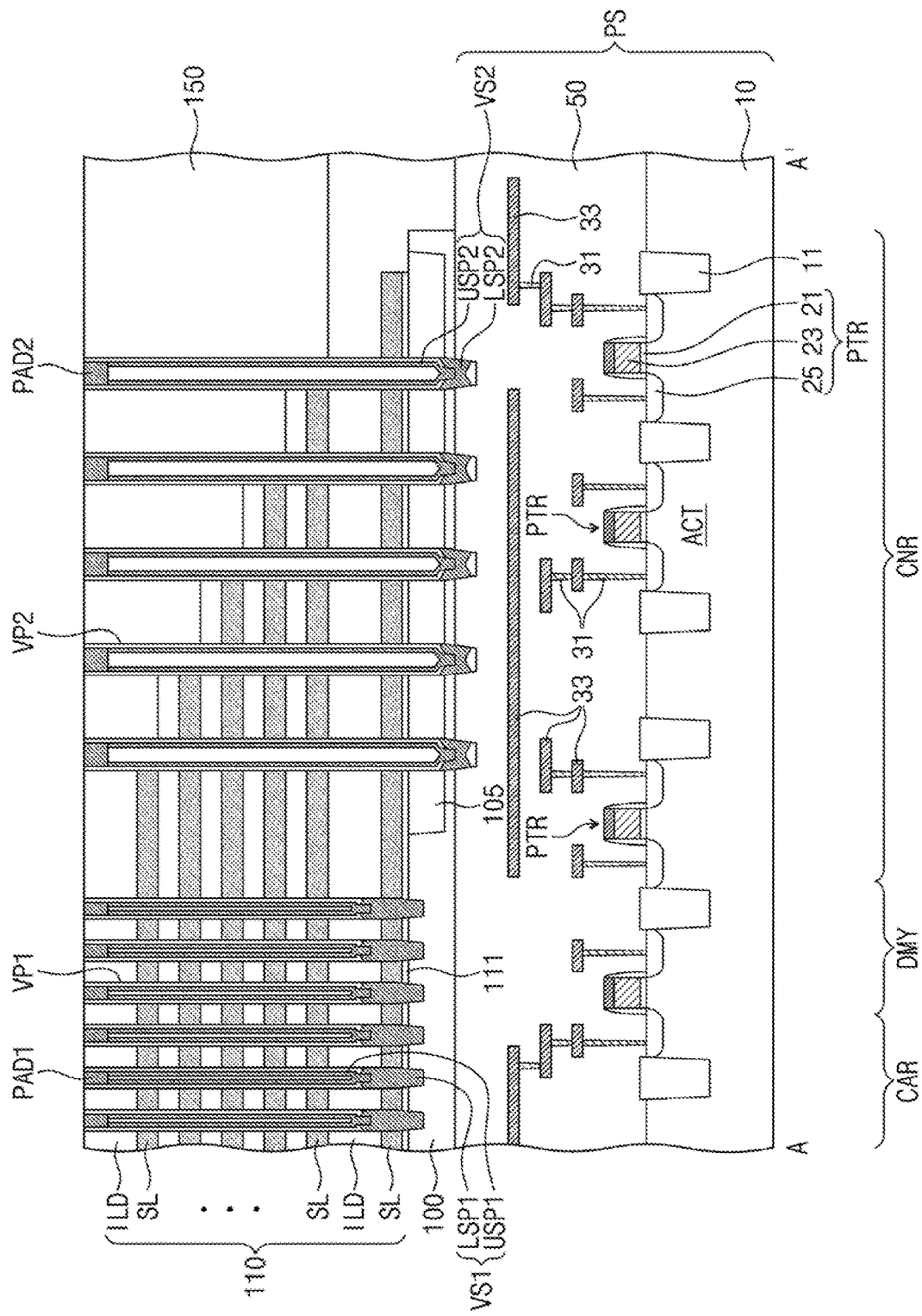
Figure 24B:
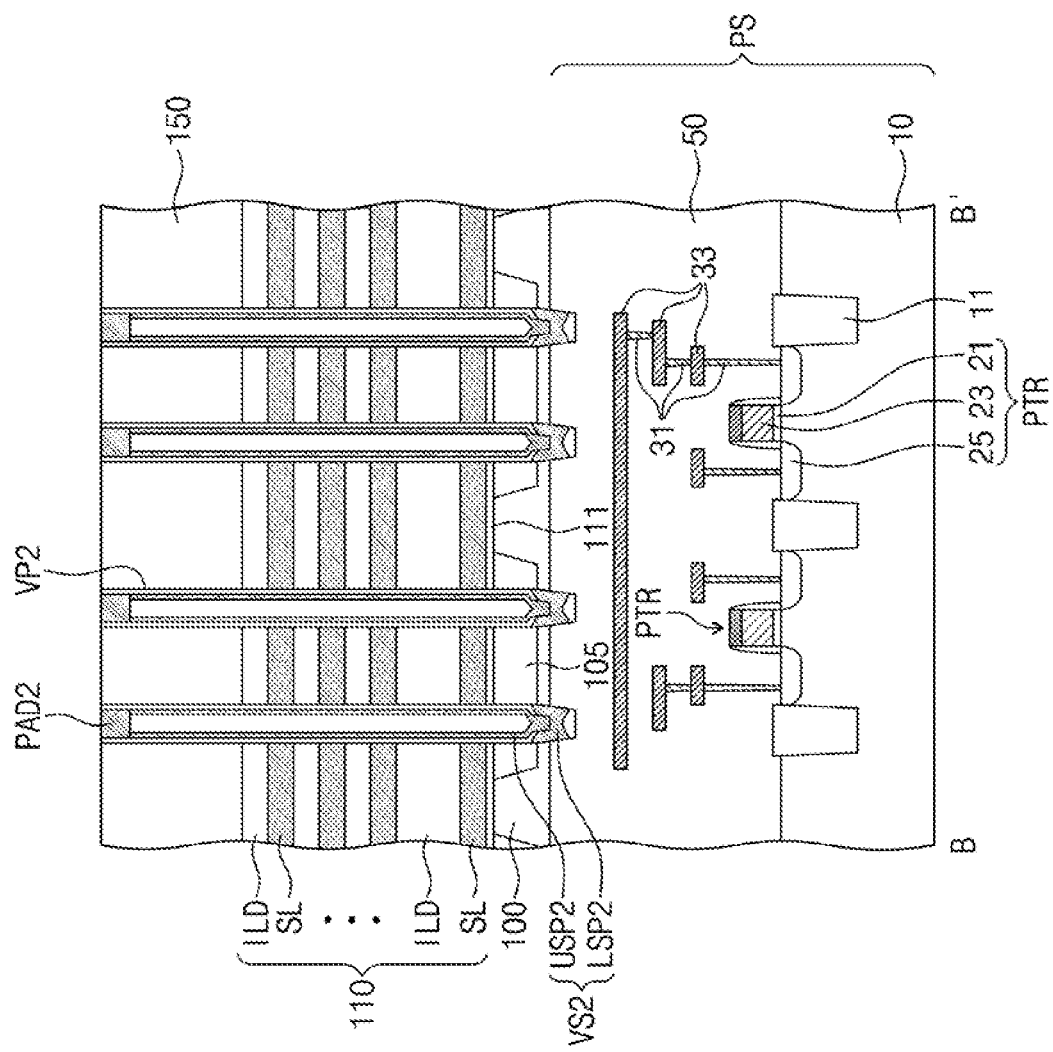

Referring to FIGS. 3A, 24A, and 24B, the first and second vertical insulating patterns VP1 and VP2 (e.g., the first and second vertical insulating patterns VP1 and VP2 described with reference to FIGS. 5A and 5B) may be formed in the first and second vertical holes VH and DH, respectively.

The formation of the first and second vertical insulating patterns VP1 and VP2 may include depositing a vertical insulating layer and a first semiconductor layer to substantially uniformly cover inner surfaces of the first and second vertical holes VH and DH, in which the first and second lower semiconductor patterns LSP1 and LSP2 are formed, and then anisotropically etching the vertical insulating layer and the first semiconductor layer to partially expose the first and second lower semiconductor patterns LSP1 and LSP2. The first and second vertical insulating patterns VP1 and VP2 may each include one or more layers, and each of the layers may be a part of the data storing layer. The first and second vertical insulating patterns VP1 and VP2 may be formed of or include at least one of, for example, silicon oxide, silicon nitride, or high-k dielectric materials.

After the formation of the first and second vertical insulating patterns VP1 and VP2, the first and second upper semiconductor patterns USP1 and USP2 may be formed in the first and second vertical holes VH and DH.

The first and second upper semiconductor patterns USP1 and USP2 may be connected to the first and second lower semiconductor patterns LSP1 and LSP2, respectively. Thus, the first vertical structures VS1, each of which includes the first lower semiconductor pattern LSP1 and the first upper semiconductor pattern USP1, may be formed in the first vertical holes, respectively, and the second vertical structures VS2, each of which includes the second lower semiconductor pattern LSP2 and the second upper semiconductor pattern USP2, may be formed in the second vertical holes DH, respectively.

The first and second upper semiconductor patterns USP1 and USP2 may be formed by depositing a semiconductor layer to substantially uniformly cover inner surfaces of the first and second vertical holes VH and DH, in which the first and second vertical insulating patterns VP1 and VP2 are provided. In an exemplary embodiment of the present inventive concept, the semiconductor layer may be conformally formed in the first and second vertical holes VH and DH, but the semiconductor layer may be too thin to completely fill the first and second vertical holes VH and DH. Accordingly, the first and second upper semiconductor patterns USP1 and USP2 may define empty or gap regions, which are located in the first and second vertical holes VH and DH and are substantially filled with an insulating gapfill layer or a gaseous material.

The bit-line conductive pad PAD1 and the dummy conductive pad PAD2 may be formed in or on top portions of the first and second upper semiconductor patterns USP1 and USP2. The bit-line and dummy conductive pads PAD1 and PAD2 may be impurity-doped regions or may be formed to include a conductive material.

Figure 25A:
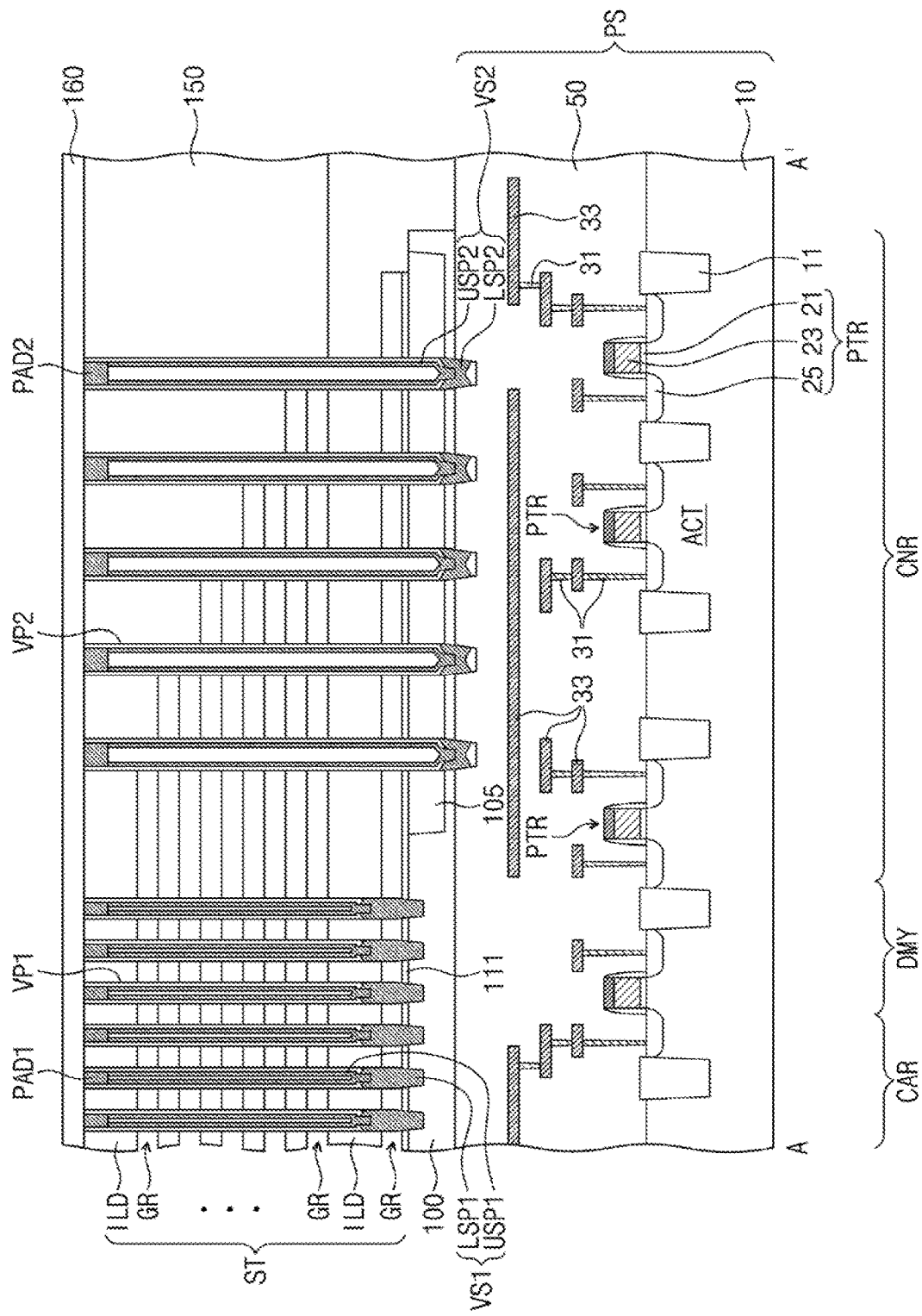
Figure 25B:
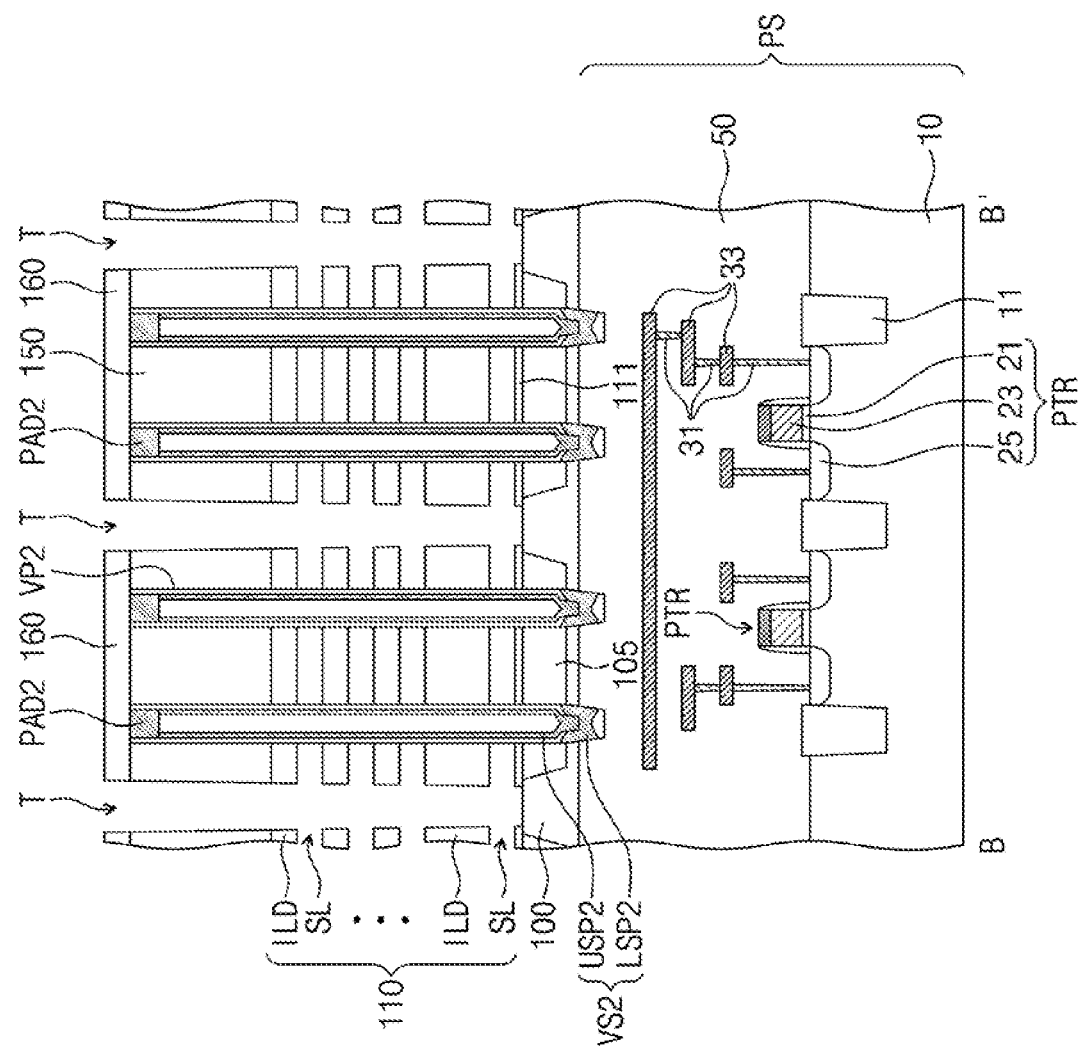

Referring to FIGS. 3A, 25A, and 25B, the first interlayered insulating layer 160 may be provided on the planarized insulating layer 150 to cover the top surfaces of the first and second vertical structures VS1 and VS2.

After the formation of the first interlayered insulating layer 160, a replacement process may be performed to replace the sacrificial layers SL with the electrodes EL. For example, the replacement process may include forming trenches T to penetrate the first interlayered insulating layer 160, the planarized insulating layer 150, and the mold structure 110 and to expose the horizontal semiconductor layer 100, removing the sacrificial layers SL exposed by the trenches T to form gate regions GR between the insulating layers ILD, and forming the electrodes EL in the gate regions GR, respectively. The trenches T may be formed to extend in the first direction D1 from the cell array region CAR to the connection region CNR and to be spaced apart from each other in the second direction D2 crossing the first direction D1. The trenches T may be formed to be spaced apart from the first and second vertical structures VS1 and VS2 and to expose side surfaces of the sacrificial and insulating layers SL and ILD.

The formation of the gate regions GR may include isotropically etching the sacrificial layers SL using an etch recipe, which is selected to have an etch selectivity with respect to the planarized insulating layer 150, the insulating layers ILD, the first and second vertical structures VS1 and VS2, and the horizontal semiconductor layer 100.

In an exemplary embodiment of the present inventive concept, the lowermost ones of the gate regions GR may be formed to partially expose the side surfaces of the first lower semiconductor patterns LSP1 on the cell array region CAR and to partially expose the side surfaces of the second vertical insulating patterns VP2 on the connection region CNR. As an example, in the process of removing the sacrificial layers SL from the mold structure 110, the second lower semiconductor patterns LSP2 might not be exposed to the gate regions GR.

Figure 26A:
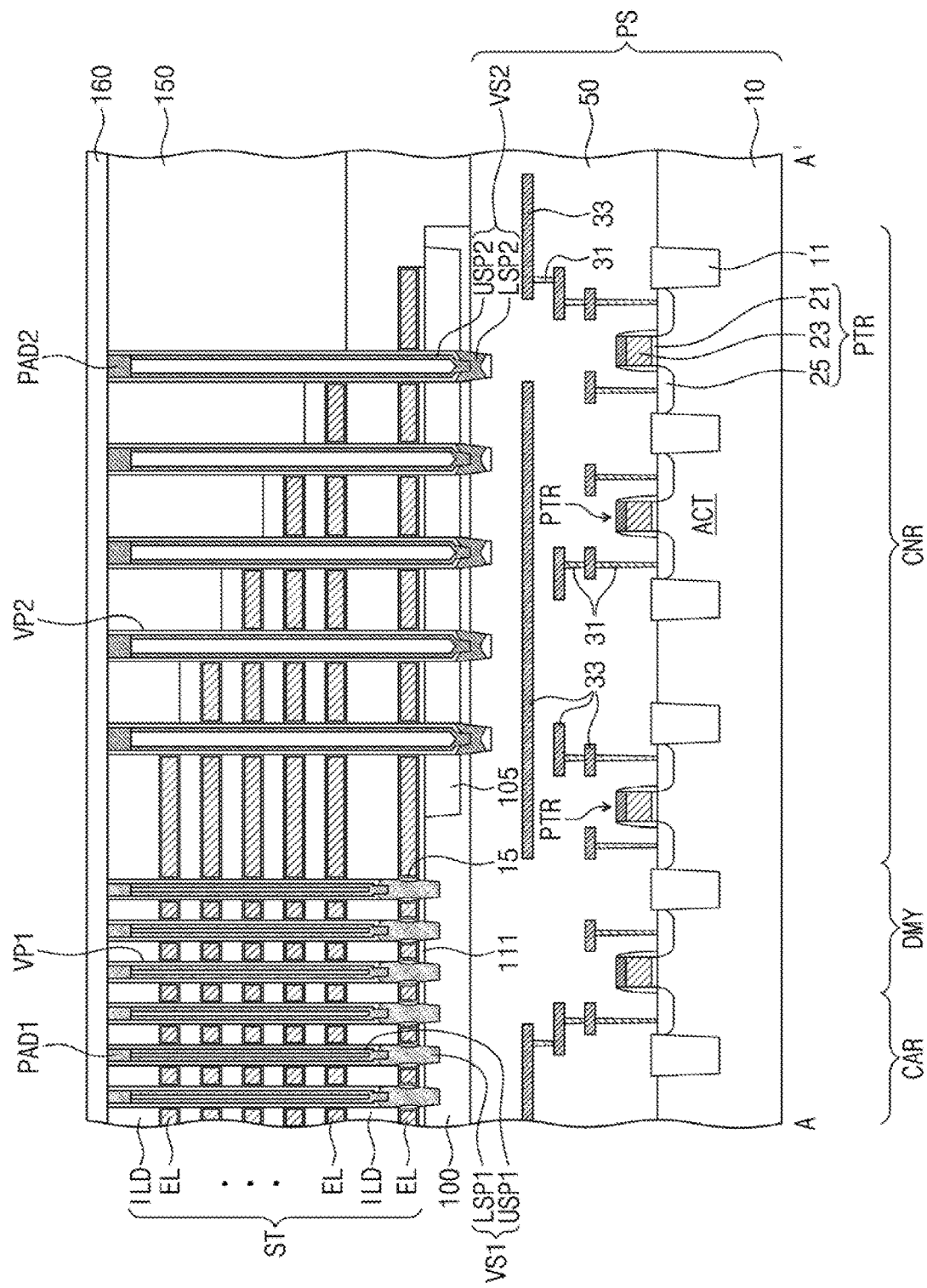

Referring to FIGS. 3A, 26A, and 26B, the gate insulating layer 15 may be formed on the side surfaces of the first lower semiconductor patterns LSP1 exposed by the lowermost ones of the gate regions GR. The gate insulating layer 15 may be formed by a thermal treatment process, in which an oxygen-including ambient gas is used. Accordingly, the side surface of the first lower semiconductor pattern LSP1 exposed by the gate region GR may be thermally oxidized to form the gate insulating layer 15.

Thereafter, the electrodes EL may be formed in the gate regions OR, respectively, and the formation of the electrodes EL may include sequentially forming a horizontal insulating layer, a barrier metal layer, and a metal layer to substantially cover the mold structure 110 with the gate regions GR, and anisotropically etching the barrier metal layer and the metal layer in the trenches. The horizontal insulating layer may include a silicon oxide layer and/or a high-k dielectric layer and may be used as a part of the data storing layer. In an exemplary embodiment of the present inventive concept, the barrier metal layer may be formed of or include at least one of metal nitrides (e.g., TiN, TaN, or WN). The metal layer may be formed of or include at least one of metal materials (e.g., W, Al, Ti, Ta, Co, or Cu).

As a result of the replacement process, the electrode structure ST including the electrodes EL may be formed on the substrate 10. In an exemplary embodiment of the present inventive concept, each of the electrode structure ST may include the electrodes EL and the insulating layers ILD, which are alternately and repeatedly stacked (e.g., vertically stacked) on the substrate 10.

The common source regions CSR may be formed in the horizontal semiconductor layer 100 exposed by the trenches. The common source regions CSR may extend parallel to each other and in the first direction D1 and may be spaced apart from each other in the second direction D2. The common source regions CSR may be formed by doping the horizontal semiconductor layer 100 with impurities, whose conductivity type is different from that of the horizontal semiconductor layer 100. The common source regions CSR may include, for example, n-type impurities (e.g., arsenic (As) or phosphorus (P)).

The insulating spacer SP may be formed to substantially cover the side surfaces of the electrode structures ST. The formation of the insulating spacers SP may include depositing a spacer layer to substantially uniformly cover the horizontal semiconductor layer 100 provided with the electrode structures ST and then performing an etch-back process on the spacer layer to expose the common source region CSR. The spacer layer may be formed of or include an insulating material (e.g., silicon oxide, silicon nitride, silicon oxynitride, or low-k dielectric materials).

The common source plugs CSP may be formed in the trenches, respectively, in which the insulating spacers SP are provided. In an exemplary embodiment of the present inventive concept, the common source plugs CSP may be provided between a horizontally-adjacent pair of the electrodes EL, and the insulating spacers SP may be interposed between the electrodes EL and the common source plug CSP. As an example, the side surfaces of the common source plugs CSP may be substantially covered with the insulating spacers SP. The common source plugs CSP may extend parallel to the electrodes EL, and the top surfaces of the common source plugs CSP may be positioned at a level higher than those of the first and second vertical structures VS1 and VS2.

Referring back to FIGS. 4A, 4B, and 4C, the second interlayered insulating layer 170 may be formed on the first interlayered insulating layer 160 to cover the top surface of the common source plug CSP. The bit line contact plugs BPLG may be formed to penetrate the first and second interlayered insulating layers 160 and 170, and in an exemplary embodiment of the present inventive concept, the bit line contact plugs BPLG may be coupled to the first vertical structures VS1, respectively. Furthermore, the cell contact plugs CPLG may be formed on the connection region CNR and may be coupled to the electrodes EL, respectively, and the penetration plugs TPLG may be formed to penetrate the first and second interlayered insulating layers 160 and 170, the planarized insulating layer 150, and the horizontal semiconductor layer 100 and may be coupled to the peripheral circuit lines 33. The bit lines BL and the connection lines CL may be formed on the second interlayered insulating layer 170.

According to an exemplary embodiment of the present inventive concept of the inventive concept, in vertical structures on a connection region, an epitaxial pattern is formed to have a top surface positioned below the lowermost electrode, and thus, it may be possible to reduce a variation in distance between an upper semiconductor pattern of the vertical structure and an electrode structure. Furthermore, it may be possible to reduce or eliminate a breakdown of voltage characteristics of ground selection transistors, which are provided on the connection region.

In addition, when vertical structures including epitaxial patterns are formed on the cell array region and the connection region, a portion of a horizontal semiconductor layer, which is provided between a lower insulating layer and a dummy insulating pattern may be used as a seed layer, and thus, it may be possible to prevent epitaxial patterns from being grown from a side surface of a mold structure, which is exposed by vertical holes formed on the connection region.

While the present inventive concept has been shown and described with reference to the exemplary embodiments thereof, it will be apparent to those of ordinary skill in the art that various changes in form and detail may be made thereto without departing from the spirit and scope of the present inventive concept.

What is claimed is:

1. A three-dimensional semiconductor memory device, comprising:
    a horizontal semiconductor layer provided on a lower insulating layer, the horizontal semiconductor layer including a cell array region and a connection region;
    an electrode structure including electrodes, wherein the electrodes are stacked on the horizontal semiconductor layer to have a staircase structure on the connection region;
    a plurality of first vertical structures provided on the cell array region to penetrate the electrode structure, each of the first vertical structures comprises a first lower semiconductor pattern and a first upper semiconductor pattern on the first lower semiconductor pattern; and
    a plurality of second vertical structures provided on the connection region to penetrate the electrode structure and the horizontal semiconductor layer, each of the second vertical structures comprises a second lower semiconductor pattern and a second upper semiconductor pattern on the second lower semiconductor pattern,
    wherein bottom surfaces of the second vertical structures are positioned at a level lower than a bottom surface of the horizontal semiconductor layer.

2. The device of claim 1, wherein bottom surfaces of the first vertical structures are positioned at a level that is lower than a bottom surface of a lowermost one of the electrodes and is higher than the bottom surface of the horizontal semiconductor layer.

3. The device of claim 1, farther comprising a dummy insulating pattern, which is provided on the connection region and in the horizontal semiconductor layer,
    wherein the second vertical structures are provided to penetrate the dummy insulating pattern.

4. The device of claim 3, wherein a bottom surface of the dummy insulating pattern is positioned at a level that is lower than bottom surfaces of the first vertical structures and is higher than the bottom surface of the horizontal semiconductor layer.

5. The device of claim 3, wherein
    in the second vertical structures, side surfaces of the second lower semiconductor patterns are in direct contact with the horizontal semiconductor layer located between the dummy insulating pattern and the lower insulating layer.

6. The device of claim 1, wherein
    in the first vertical structures, top surfaces of the first lower semiconductor patterns are positioned at a level higher than atop surface of a lowermost one of the electrodes, and
    in the second vertical structures, top surfaces of the second lower semiconductor patterns are positioned at a level lower than a bottom surface of the lowermost one of the electrodes.

7. The device of claim 6, wherein, in the second vertical structures, each of the second lower semiconductor patterns has a non-flat bottom surface.

8. The device of claim 6, wherein each of the second vertical structures comprises an air gap between the second lower semiconductor pattern and the lower insulating layer.

9. The device of claim 6, further comprising:
    first vertical insulating patterns provided between the upper semiconductor patterns of the in vertical structures and the electrode structure, bottom surfaces of the first vertical insulating patterns being positioned at a level higher than a top surface of the lowermost one of the electrodes; and
    second vertical insulating patterns provided between the upper semiconductor patterns of the second vertical structures and the electrode structure, bottom surfaces of the second vertical insulating patterns being positioned at a level lower than a bottom surface of the lowermost one of the electrodes.

10. The device of claim 6, further comprising a gate insulating layer interposed between the lower semiconductor patterns of the first vertical structures and the lowermost one of the electrodes.

11. The device of claim 1, further comprising:
    peripheral logic circuits disposed on a semiconductor substrate; and
    peripheral circuit lines connected to the peripheral logic circuits,
    wherein the lower insulating layer is provided on the peripheral logic circuits and the peripheral circuit lines.

12. A three-dimensional semiconductor memory device, comprising:
    a horizontal semiconductor layer on a lower insulating layer, the horizontal semiconductor layer comprising a cell array region and a connection region;
    an electrode structure including electrodes, wherein the electrodes are stacked on the horizontal semiconductor layer;
    a plurality of first vertical structures provided on the cell array region to penetrate the electrode structure; and
    a plurality of second vertical structures provided on the connection region to penetrate the electrode structure and the horizontal semiconductor layer,
    wherein each of the first and second vertical structures comprises a lower semiconductor pattern and an upper semiconductor pattern, the upper semiconductor pattern is connected to the lower semiconductor pattern, and
    in the second vertical structures, top surfaces of the lower semiconductor patterns are positioned at a level lower than a bottom surface of a lowermost one of the electrodes, and bottom surfaces of the lower semiconductor patterns are positioned at a level lower than a bottom surface of the horizontal semiconductor layer.

13. The device of claim 12, wherein, in the first vertical structures, top surfaces of the lower semiconductor patterns are positioned at a level higher than a top surface of the lowermost one of the electrodes, and bottom surfaces of the lower semiconductor patterns are positioned at a level between top and bottom surfaces of the horizontal semiconductor layer.

14. The device of claim 12, further comprising a dummy insulating pattern provided in the connection region of the horizontal semiconductor layer,
wherein the second vertical structures are provided to penetrate the dummy insulating pattern.

15. The device of claim 14, further comprising a vertical insulating pattern extending from a region between the upper semiconductor pattern of a second vertical structure of the plurality of second vertical structure and the electrode structure to another region between the dummy insulating pattern and the upper semiconductor pattern of the second vertical structure.

16. The device of claim 14, wherein, in the second vertical structures, the lower semiconductor patterns are provided between a bottom surface of the dummy insulating pattern and a top surface of the lower insulating layer to be in direct contact with a portion of the horizontal semiconductor layer.

17. The device of claim 12, further comprising:
peripheral logic circuits disposed on a semiconductor substrate; and
peripheral circuit lines connected to the peripheral logic circuits,
wherein the lower insulating layer is provided on the peripheral logic circuits and the peripheral circuit lines.

18. A three-dimensional semiconductor memory device, comprising:
a horizontal semiconductor layer provided on a lower insulating layer, the horizontal semiconductor layer comprising a cell array region and a connection region;
a dummy insulating pattern provided in the connection region of the horizontal semiconductor layer;
an electrode structure including electrodes, wherein the electrodes are stacked on the horizontal semiconductor layer to have a staircase structure on the dummy insulating pattern;
a plurality of first vertical structures provided on the cell array region to penetrate the electrode structure;
first vertical insulating patterns provided between the first vertical structures and the electrode structure;
a plurality of second vertical structures provided on the connection region to penetrate the electrode structure, the dummy insulating pattern, and the horizontal semiconductor layer; and
second vertical insulating patterns provided between the second vertical structures and the electrode structure, and between the second vertical structures and the dummy insulating pattern.

19. The device of claim 18, wherein bottom surfaces of the first vertical structures are positioned at a level higher than bottom surfaces of the second vertical structures, and
the bottom surfaces of the second vertical structures are, positioned at a level lower than a bottom surface of the horizontal semiconductor layer.

20. The device of claim 19, wherein each of the first and second vertical structures comprises a lower semiconductor pattern and an upper semiconductor pattern, the upper semiconductor pattern is connected to the lower semiconductor pattern, and
in the second vertical structures, bottom surfaces of the upper semiconductor patterns are positioned at a level lower than a bottom surface of the dummy insulating pattern.

* * * * *